United States Patent
Whetsel

(10) Patent No.: US 10,557,887 B2
(45) Date of Patent: Feb. 11, 2020

(54) TAP, COUNTER STORING VALUE OF SERIAL ACCESS BY COMMUNICATION CIRCUITRY

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/290,329

(22) Filed: Mar. 1, 2019

(65) Prior Publication Data

US 2019/0195946 A1    Jun. 27, 2019

Related U.S. Application Data

(62) Division of application No. 16/173,658, filed on Oct. 29, 2018, now Pat. No. 10,267,851, which is a division of application No. 15/882,045, filed on Jan. 29, 2018, now Pat. No. 10,145,895, which is a division of application No. 15/871,602, filed on Jan. 15, 2018, now Pat. No. 10,036,776, which is a division of application No. 15/291,568, filed on Oct. 12, 2016, now Pat. No. 9,891,278, which is a division of application No. 14/822,301, filed on Aug. 10, 2015, now Pat. No. 9,494,643, which is a division of application No. 14/596,766, filed on Jan. 14, 2015, now Pat. No. 9,134,369, which is a division of application No. 14/444,236, filed on Jul. 28, 2014, (Continued)

(51) Int. Cl.
| | |
|---|---|
| *G01R 31/28* | (2006.01) |
| *G01R 31/317* | (2006.01) |
| *G01R 31/3185* | (2006.01) |
| *G06F 11/267* | (2006.01) |
| *G01R 31/3177* | (2006.01) |

(52) U.S. Cl.
CPC ..... *G01R 31/31723* (2013.01); *G01R 31/317* (2013.01); *G01R 31/3177* (2013.01); *G01R 31/31705* (2013.01); *G01R 31/31727* (2013.01); *G01R 31/318533* (2013.01); *G01R 31/318536* (2013.01); *G01R 31/318591* (2013.01); *G01R 31/318597* (2013.01); *G06F 11/267* (2013.01)

(58) Field of Classification Search
None
See application file for complete search history.

(56) References Cited

U.S. PATENT DOCUMENTS

| | | |
|---|---|---|
| 5,054,024 A | 10/1991 | Whetsel |
| 5,056,093 A | 10/1991 | Whetsel |
| (Continued) | | |

OTHER PUBLICATIONS

B. G. West, "Simultaneous bidirectional test data flow for a low-cost wafer test strategy," Test Conference, 2003, Proceedings. ITC 2003. International, 2003, pp. 947-951.

(Continued)

*Primary Examiner* — Guerrier Merant
(74) *Attorney, Agent, or Firm* — Lawrence J. Bassuk; Charles A. Brill; Frank D. Cimino

(57) ABSTRACT

The present disclosure describes using the JTAG Tap's TMS and/or TCK terminals as general purpose serial Input/Output (I/O) Manchester coded communication terminals. The Tap's TMS and/or TCK terminal can be used as a serial I/O communication channel between; (1) an IC and an external controller, (2) between a first and second IC, or (3) between a first and second core circuit within an IC. The use of the TMS and/or TCK terminal as serial I/O channels, as described, does not effect the standardized operation of the JTAG Tap, since the TMS and/or TCK I/O operations occur while the Tap is placed in a non-active steady state.

7 Claims, 17 Drawing Sheets

Related U.S. Application Data now Pat. No. 8,972,810, which is a division of application No. 14/162,976, filed on Jan. 24, 2014, now Pat. No. 8,826,090, which is a division of application No. 14/102,624, filed on Dec. 11, 2013, now Pat. No. 8,826,089, which is a division of application No. 13/757,361, filed on Feb. 1, 2013, now Pat. No. 8,635,504, which is a division of application No. 13/468,173, filed on May 10, 2012, now Pat. No. 8,392,773, which is a division of application No. 12/966,136, filed on Dec. 13, 2010, now Pat. No. 8,230,280, which is a division of application No. 12/782,129, filed on May 18, 2010, now Pat. No. 7,873,889, which is a division of application No. 12/351,510, filed on Jan. 9, 2009, now Pat. No. 7,747,918, which is a division of application No. 11/857,688, filed on Sep. 19, 2007, now Pat. No. 7,493,535, which is a division of application No. 11/015,816, filed on Dec. 17, 2004, now Pat. No. 7,284,170.

(60) Provisional application No. 60/534,298, filed on Jan. 5, 2004.

(56) References Cited

U.S. PATENT DOCUMENTS

| | | | |
|---|---|---|---|
| 5,596,734 | A | 1/1997 | Ferra |
| 5,640,521 | A | 6/1997 | Whetsel |
| 6,081,885 | A | 6/2000 | Deao et al. |
| 6,085,344 | A | 7/2000 | Whetsel et al. |
| 6,125,464 | A | 9/2000 | Jin |
| 6,378,093 | B1 | 4/2002 | Whetsel |
| 6,385,749 | B1 | 5/2002 | Adusumilli et al. |
| 6,389,557 | B1 | 5/2002 | Yu et al. |
| 6,393,081 | B1 | 5/2002 | Whetsel |
| 6,525,588 | B2 | 2/2003 | Saeki |
| 6,639,422 | B1 | 10/2003 | Albean |
| 6,654,917 | B1 | 11/2003 | Floyd et al. |
| 6,829,730 | B2 | 12/2004 | Nadeau-Dostie et al. |
| 6,947,884 | B2 | 9/2005 | Swoboda |
| 6,988,207 | B2 | 1/2006 | Chan et al. |
| 7,003,707 | B2 | 2/2006 | Whetsel |
| 7,047,467 | B1 | 5/2006 | Khu et al. |
| 7,747,918 | B2 | 6/2010 | Whetsel |
| 8,230,280 | B2 | 7/2012 | Whetsel |
| 8,392,773 | B2 | 3/2013 | Whetsel |
| 9,134,369 | B2 | 9/2015 | Whetsel |
| 2002/0002691 | A1 | 1/2002 | Whetsel |
| 2002/0147950 | A1 | 10/2002 | Whetsel |
| 2003/0046622 | A1 | 3/2003 | Whetsel |
| 2006/0212760 | A1 | 9/2006 | Swoboda |
| 2006/0279439 | A1 | 12/2006 | Swoboda |

OTHER PUBLICATIONS

T. Takahashi et al., "110-GB/s simultaneous bidirectional transceiver logic synchronized with a system clock," in IEEE Journal Solid-State Circuits, vol. 34, No. 11, pp. 1526-1533, Nov. 1999.
David J. Cheek and R. Dandapani, Integration of IEEE Std. 1149.1 and Mixed Signal Test Architectures, 1995, pp. 569-576.

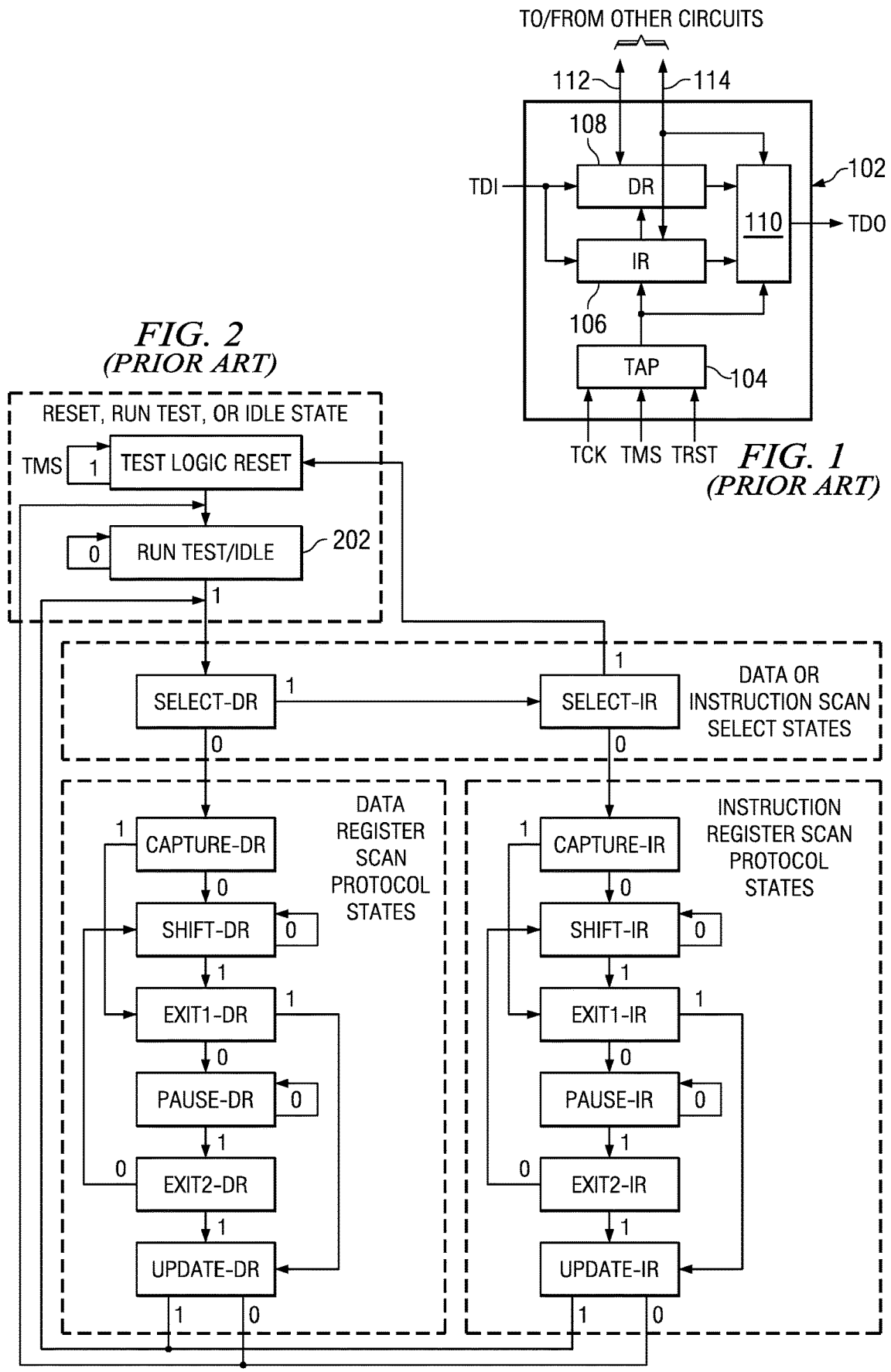

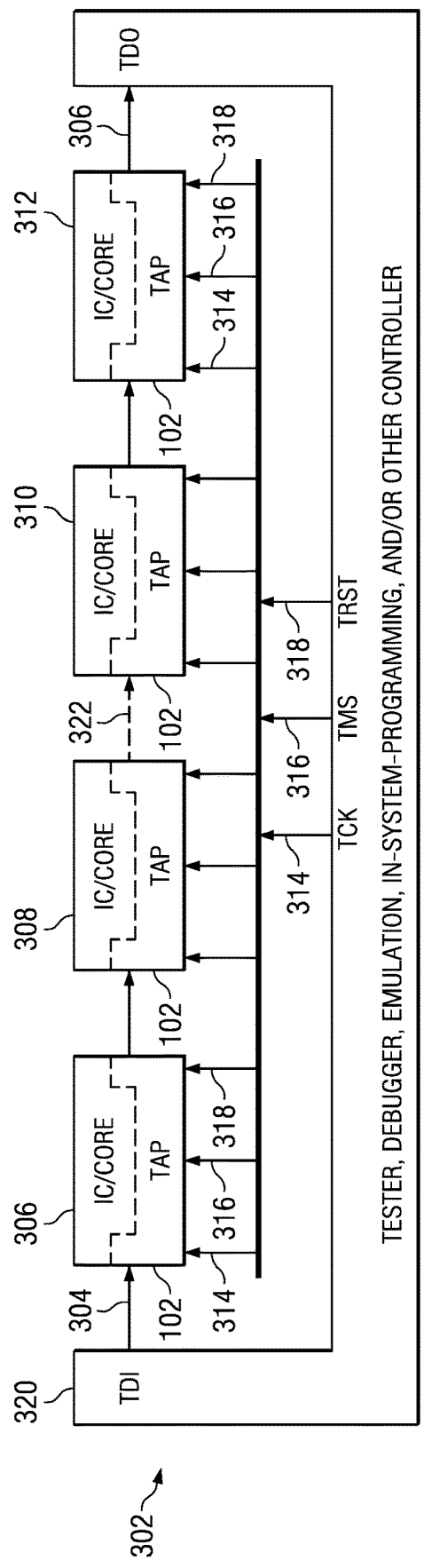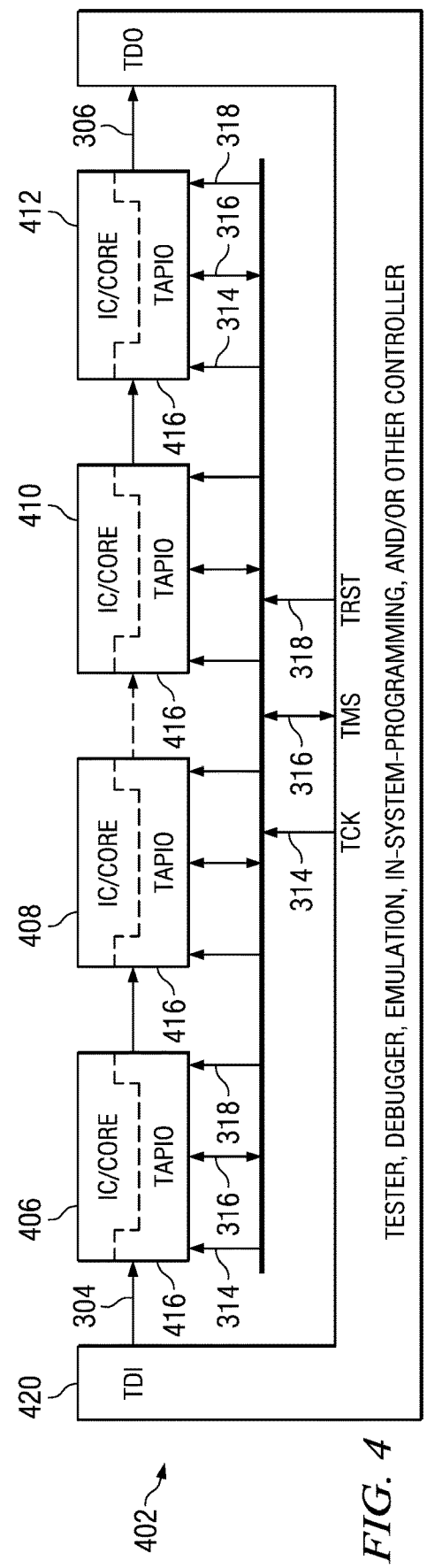

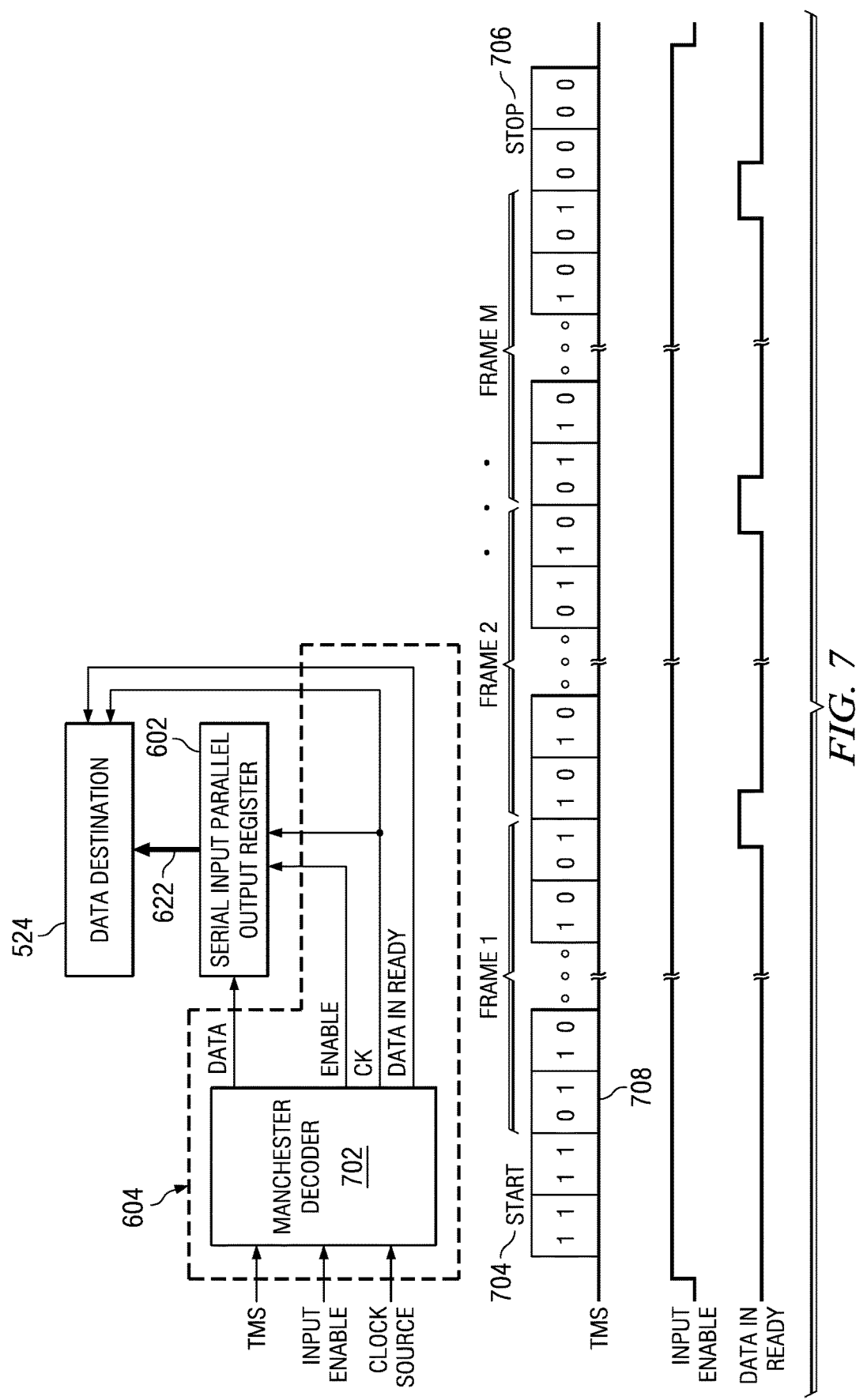

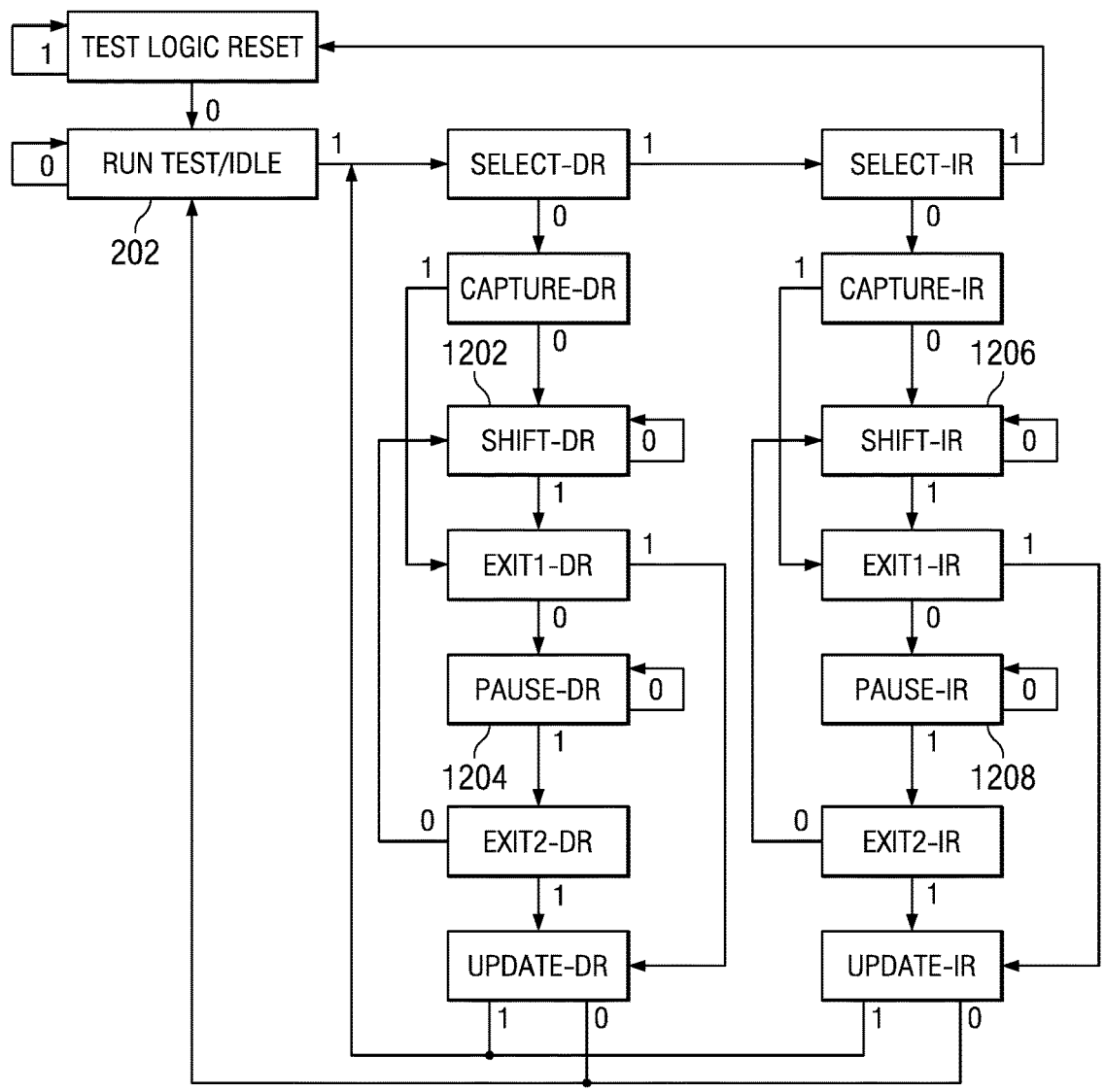
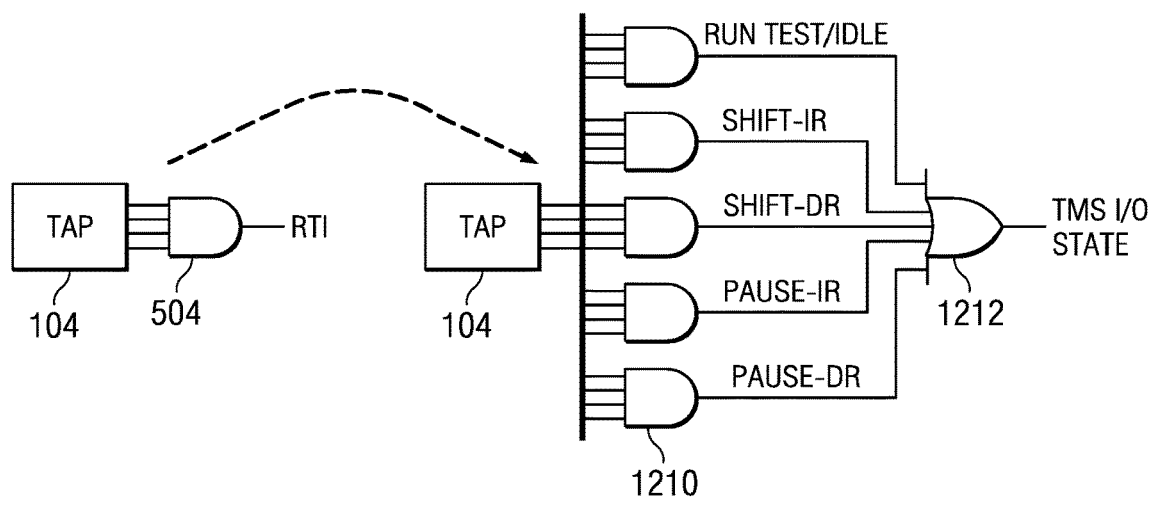
*FIG. 12*

TAP, COUNTER STORING VALUE OF SERIAL ACCESS BY COMMUNICATION CIRCUITRY

CROSS-REFERENCE TO RELATED APPLICATIONS

This application is a divisional of application Ser. No. 16/173,658, filed Oct. 29, 2018, now U.S. Pat. No. 10,267,851, issued Apr. 23, 2019;

Which was a divisional of application Ser. No. 15/882,045, filed Jan. 29, 2018, now U.S. Pat. No. 10,145,895, issued Dec. 4, 2018;

Which was a divisional of application Ser. No. 15/871,602 filed Jan. 15, 2018, now U.S. Pat. No. 10,036,776, issued Jul. 31, 2018;

Which is a divisional of application Ser. No. 15/291,568, filed Oct. 12, 2016, now U.S. Pat. No. 9,891,278, issued Feb. 13, 2018;

Which was a divisional of prior application Ser. No. 14/822,301, filed Aug. 10, 2015, now U.S. Pat. No. 9,494,643, issued Nov. 15, 2016;

Which was a divisional of application Ser. No. 14/596,766, filed Jan. 14, 2015, now U.S. Pat. No. 9,134,369, issued Sep. 15, 2015;

Which was a divisional of application Ser. No. 14/444,236, filed Jul. 28, 2014, now U.S. Pat. No. 8,972,810, issued Mar. 3, 2015;

Which was a divisional of application Ser. No. 14/162,976, filed Jan. 24, 2014, now U.S. Pat. No. 8,826,090, issued Sep. 2, 2014;

Which was a divisional of application Ser. No. 14/102,624, filed Dec. 11, 2013, now U.S. Pat. No. 8,826,089, issued Sep. 2, 2014;

Which was a divisional of application Ser. No. 13/757,361, filed Feb. 1, 2013, now U.S. Pat. No. 8,635,504, issued Jan. 21, 2014;

Which was a divisional of application Ser. No. 13/468,173, filed May 10, 2012, now U.S. Pat. No. 8,392,773, issued Mar. 5, 2013;

Which was a divisional of application Ser. No. 12/966,136, filed Dec. 13, 2010, now U.S. Pat. No. 8,230,280, issued Jul. 24, 2012;

Which was a divisional of application Ser. No. 12/782,129, filed May 18, 2010, now U.S. Pat. No. 7,873,889, issued Jan. 18, 2011;

Which was a divisional of application Ser. No. 12/351,510, filed Jan. 9, 2009 now U.S. Pat. No. 7,747,918, issued Jun. 29, 2010;

which is a divisional of application Ser. No. 11/857,688, filed Sep. 19, 2007, now U.S. Pat. No. 7,493,535, issued Feb. 17, 2009;

which is a divisional of application Ser. No. 11/015,816, filed Dec. 17, 2004, now U.S. Pat. No. 7,284,170, issued Oct. 16, 2007;

which claims priority from Provisional Application No. 60/534,298, filed Jan. 5, 2004.

This application is related to U.S. patent application Ser. No. 10/983,256, filed Nov. 4, 2004, now U.S. Pat. No. 7,284,170, issued Oct. 16, 2007, which is incorporated herein by reference.

BACKGROUND

Field

This disclosure relates in general to circuit designs, and in particular to an improvement in the design of IEEE 1149.1 Tap interfaces of ICs and core circuits for improved communication of test, debug, emulation, programming, and general purpose I/O operations.

Today's ICs may contain many embedded 1149.1 Tap architectures (Tap domains). Some of these TAP domains are associated with intellectual property (IP) core circuits within the IC, and serve as access interfaces to test, debug, emulation, and programming circuitry within the IP cores. Other TAP domains may exist in the IC which are not associated with cores but rather to circuitry in the IC external of the cores. Further, the IC itself will typically contain a TAP domain dedicated for operating the boundary scan register associated with the input and output terminals of the ICs, according to IEEE std 1149.1.

FIG. 1 illustrates a simple example of an IEEE 1149.1 Tap domain 102. The Tap domain includes a Tap controller 104, an instruction register (IR) 106, at least two data registers (DR) 108, and multiplexer circuitry 110. The Tap domain interface consists of a TDI input, a TCK input, a TMS input, a TRST input, and a TDO output. In response to TCK and TMS control inputs to Tap controller 104, the Tap controller outputs control to capture data into and shift data through either the IR 106 from TDI to TDO or a selected DR 108 from TDI to TDO. The data shifted into IR 106 is updated and output on bus 114 to other circuits, and the data shifted into a DR 108 is updated and output on bus 112 to other circuits. DR 108 may also capture data from other circuits on bus 112 and IR 106 may capture data from other circuits on bus 114. In response to a TRST input to the Tap controller 104, the TAP controller, IR and DR are reset to known states. The structure and operation of IEEE 1149.1 Tap domain architectures like that of FIG. 1 are well known.

FIG. 2 illustrates the state diagram of the Tap controller 104. All IEEE 1149.1 standard Tap controllers operate according to this state diagram. State transitions occur in response to TMS input and are clocked by the TCK input. The IEEE 1149.1 Tap state diagram is well known.

FIG. 3 illustrates an example system where a number of Tap domain 102 interfaces of ICs 306-312 or embedded cores 306-312 within ICs are connected together serially, via their TDI and TDO terminals, to form a scan path 302 from TDI 304 to TDO 306. Each Tap domain 102 of the ICs/cores 306-312 are also commonly connected to TCK 314, TMS 316, and TRST 318 inputs. The scan path's TDI 304, TDO 306, TCK 314, TMS 316, and TRST 318 signals are coupled to a controller, which can serve as a test, debug, emulation, in-system-programming, and/or other application controller. While only four Tap domains 102 of ICs/cores 306-312 are shown, any number of IC/core Tap domains may exist in scan path 302, as indicated by dotted line 322. The scan path 302 arrangement of IC/core Tap domains is well known in the industry.

As seen in FIG. 3, if data is to be input to Tap domain 102 of IC/core 312 from controller 320 it must serially pass through all leading Tap domains of ICs/cores 306-310. Further, if data is to be output from Tap domain 102 IC/core 306 to controller 320 it must pass through all trailing Tap domains of ICs/cores 308-312. Thus a data input and output latency exists between Tap domains of ICs/cores in scan path 302 and controller 320. As will be seen later, the present disclosure provides a way to eliminate this data input and output latency by making use of the direct TMS 316 and/or TCK 314 connections between the Tap Domains of ICs/cores 306-312 and controller 320. Having a direct connection for data input and output between the controller 320 and the Tap domains 102, via the TMS and/or TCK connections, provides improved data communication throughput during test, debug, emulation, in-circuit-programming, and/or other type of operations. Further, using the direct TCK and/or TMS connections for data input and output between controller 320 and Tap domains 102 only involves the controller and the targeted Tap domain. Non-targeted Tap domains are not aware of or affected by the direct TMS and/or TCK communication.

SUMMARY

The present disclosure provides a method and apparatus of communicating data between; (1) an IC in a scan path and a controller of the scan path using the standard direct TMS and/or TCK connections that exists between the IC and controller, (2) a first IC of a scan path and a second IC of the scan path using the direct TMS and/or TCK connections between the ICs, (3) a first core circuit of a scan path in an IC and second core circuit of the scan path of the IC using the direct TMS and/or TCK connections between the cores. The TMS and/or TCK data I/O communication occurs while the Tap controller of the Tap domains of the IC/core are in a non-active state. Thus the TMS and/or TCK I/O communication does not disturb or modify the state of Tap domains of the IC/core in a scan path. The TMS and/or TCK I/O communication is achieved by adding circuitry to the IC/core and coupling the circuitry to the TMS and/or TCK terminals of the IC's/core's Tap domain. When enabled by control output from the IC's/core's Tap domain, the added circuitry becomes operable to input data from the Tap domain's TMS and/or TCK terminal or output data onto the Tap domain's TMS and/or TCK terminal. Conventional controllers 320 coupled to the TMS and TCK signals are improved, according to the present disclosure, such that they can input data from a Tap domain's TMS and/or TCK terminal and output data to a Tap domain's TMS and/or TCK terminal.

BRIEF DESCRIPTION OF THE DRAWINGS

FIG. 1 illustrates a conventional IEEE 1149.1 Tap domain architecture.

FIG. 2 illustrates the state diagram of a conventional IEEE 1149.1 Tap controller.

FIG. 3 illustrates a conventional arrangement of ICs or cores within ICs with their Tap domains connected in a scan path and the scan path coupled to a controller.

FIG. 4 illustrates the scan path and controller arrangement of FIG. 3 adapted for TMS I/O communication according to the present disclosure.

FIG. 7 illustrates circuitry and timing for receiving Manchester encoded TMS input data according to the present disclosure.

FIG. 12 illustrates how TMS I/O communication may occur while a Tap controller is in other states according to the present disclosure.

DETAILED DESCRIPTION

FIG. 4 illustrates a scan path system 402 of ICs/cores that include Tap domains plus additional TMS I/O circuitry. The combination of the Tap domain and TMS I/O circuitry is referred to as TAPIO 416. FIG. 4 is similar to FIG. 3 in regard to the way the TDI, TDO, TCK, TMS, and TRST signals are coupled between the TAPIOs 416 and controller 420. Controller 420 is different from controller 320 in that it has been improved according to the present disclosure to include the capability of communicating data to and from the TAPIOs 416 via the TMS connection. Controller 420 maintains the conventional ability of controller 320 to communicate the Tap domains of the TAPIOs 416 using standard IEEE 1149.1 serial protocol. As seen, the TMS connection between controller 420 and TAPIOs 416 is shown as a bidirectional signal path, as opposed to the unidirectional signal path of the TMS connection in FIG. 3. When a TAPIO 416 is selected for sending data to the controller 420 according to the present disclosure, the TMS connection will become an output from the TAPIO and an input to the controller. When a TAPIO 416 is selected for receiving data from the controller 420 according to the present disclosure, the TMS connection will become an output from the controller and an input to the TAPIO. As can be seen in FIG. 4, data is transferred directly between a selected TAPIO 416 and controller 420. Therefore the data latency problem mentioned in regard with FIG. 3 does not exist in FIG. 4.

Additionally, according to the present disclosure, one TAPIO of an IC/core in the scan path may communicate to another TAPIO of an IC/core in the scan path via the common bidirectional TMS connection. To achieve this mode of operation, the controller 420 selects one TAPIO to transmit and another TAPIO to receive. The controller then disables its TMS output driver so that the transmitting TAPIO can output on its TMS terminal to send data to the TMS terminal of the receiving TAPIO. Again, the data is directly transferred between the TAPIOs without the aforementioned latency problem.

Figure 5:
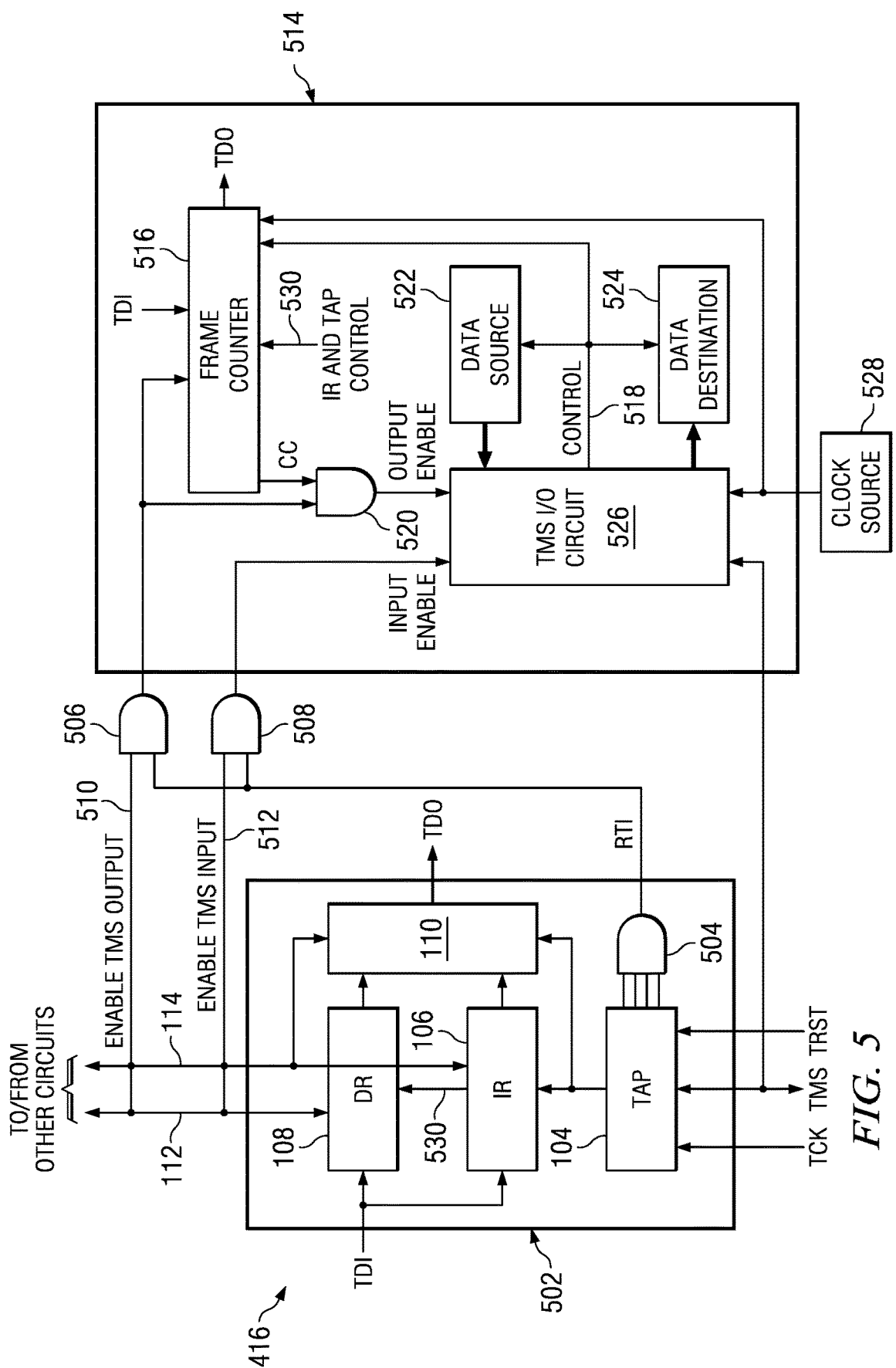
FIG. 5 illustrates TMS I/O communication circuitry coupled to a Tap domain according to the present disclosure.

FIG. 5 illustrates the TAPIO circuit 416 in more detail. As seen the TAPIO 416 consists of a Tap domain 502, a TMS communication circuit 514, or communications interface, And gates 506-508, and a Clock Source circuit 528. The Clock Source 528 can be a clock producing circuit within the IC or it can come from a pin of the IC. Tap domain 502 is similar to Tap domain 102 with the exception that it includes And gate 504 for detecting when the Tap controller 104, which includes a state machine, is in the Run Test/Idle (RTI) state 202 of FIG. 2. The Tap controller 104 is a four bit state machine defining the 16 unique states shown in FIG. 2. Each of the 16 Tap states is defined by a unique one of the four bit state machine codes. While not shown, the four inputs of the And gate 504 are inverted or not inverted to allow the And gate to detect, with a logic high output, when the Tap controller is in the Run Test/Idle state. For example, if the Run Test/Idle state has a four bit code of 0101, then the "0" inputs to And gate 504 will be inverted such that the And gate will receive all "1's" at its inputs so that it outputs a logic one when the Tap controller is in the Run Test/Idle state. This will be the case throughout the remainder of this specification for all And gates that are described for use in detecting Tap controller states. Also while And gates are shown being used to detect Tap controller states, other gating circuits may be used as well.

Further, Tap domain 502 differs from Tap domain 102 in that it includes an Enable TMS Output signal 510 and an Enable TMS Input signal 512. The Enable TMS Output signal is set whenever the TMS communication circuit 514 is to perform a data output or protocol operation on TMS. The Enable TMS Input signal is set whenever the TMS communication circuit 514 is to perform a data input or protocol operation on TMS. As seen, the Enable TMS Input or Enable TMS Output signals can come, by design choice, from either the IR 106 via bus 114 or from a DR 108 via bus 112.

When Enable TMS Output is set high and when the Tap controller 104 is in the Run Test/Idle (RTI) state 202, the output of And gate 506 will go high to enable the TMS communications circuit 514 to perform a TMS output or protocol operation. When Enable TMS Input is set high and when the Tap controller 104 is in the Run Test/Idle (RTI) state, the output of And gate 508 will go high to enable the TMS communications circuit 514 to perform a TMS input or protocol operation. During either TMS communication operation, the Tap controller 104 remains in the Run Test/Idle state 202.

TMS communication circuit 514 consists of a Frame Counter 516, And gate 520, TMS I/O Circuit 526, Data Source 522, and Data Destination 524. The Frame Counter 516 is a data register 108 that can be scanned via TDI and TDO by the Tap controller 104 to load a count of the number of data frames that are to be sent from the Data Source 522 during a TMS output operation. A data frame in this disclosure is defined by a fixed number of transmitted data bits. After being scanned, and when enabled by the output of And gate 506, the Frame Counter operates as a counter to count the number of data frames output on TMS. After all data frames have been sent out on TMS, the count complete (CC) output from the Frame Counter will go low to halt the TMS output operation of TMS I/O Circuit 526, via And gate 520. And gate 520 is gated on and off by the Enable TMS Output signal being high and low respectively. When gated off, the CC output from the Frame Counter cannot inadvertently, say during an 1149.1 protocol operation that passes through the Run Test/Idle state, enable the TMS I/O Circuit 526. The Frame Counter receives IR & Tap Control input via bus 530 for scanning in the count, control input 518 from the TMS I/O Circuit 526 for knowing when to count a frame, and a clock input from the Clock Source circuit 528.

When enabled for inputting data from TMS in one communications protocol, the TMS I/O Circuit 526 receives the TMS data and transfers it to the Data Destination circuitry 524. Data Destination circuitry 524 may be any circuitry within an IC including but not limited to; (1) an address bus, (2) a data bus, (3) a Ram memory, (4) a Cache memory, (5) a register file, (6) a FIFO, (7) a register, (8) a processor, (9) a peripheral circuit, or (10) a bus coupled to circuitry external to the IC.

When enabled for outputting data on TMS in another communications protocol, the TMS I/O Circuit 526 receives data from the Data Source circuitry 522 and outputs the data on TMS. Data Source circuitry 522 may be any circuitry within an IC including but not limited to; (1) an address bus, (2) a data bus, (3) a Ram memory, (4) a Rom memory, (5) a Cache memory, (6) a register file, (7) a FIFO, (8) a register, (9) a processor, (10) a peripheral circuit, or (11) a bus coupled to circuitry external to the IC.

Figure 6:
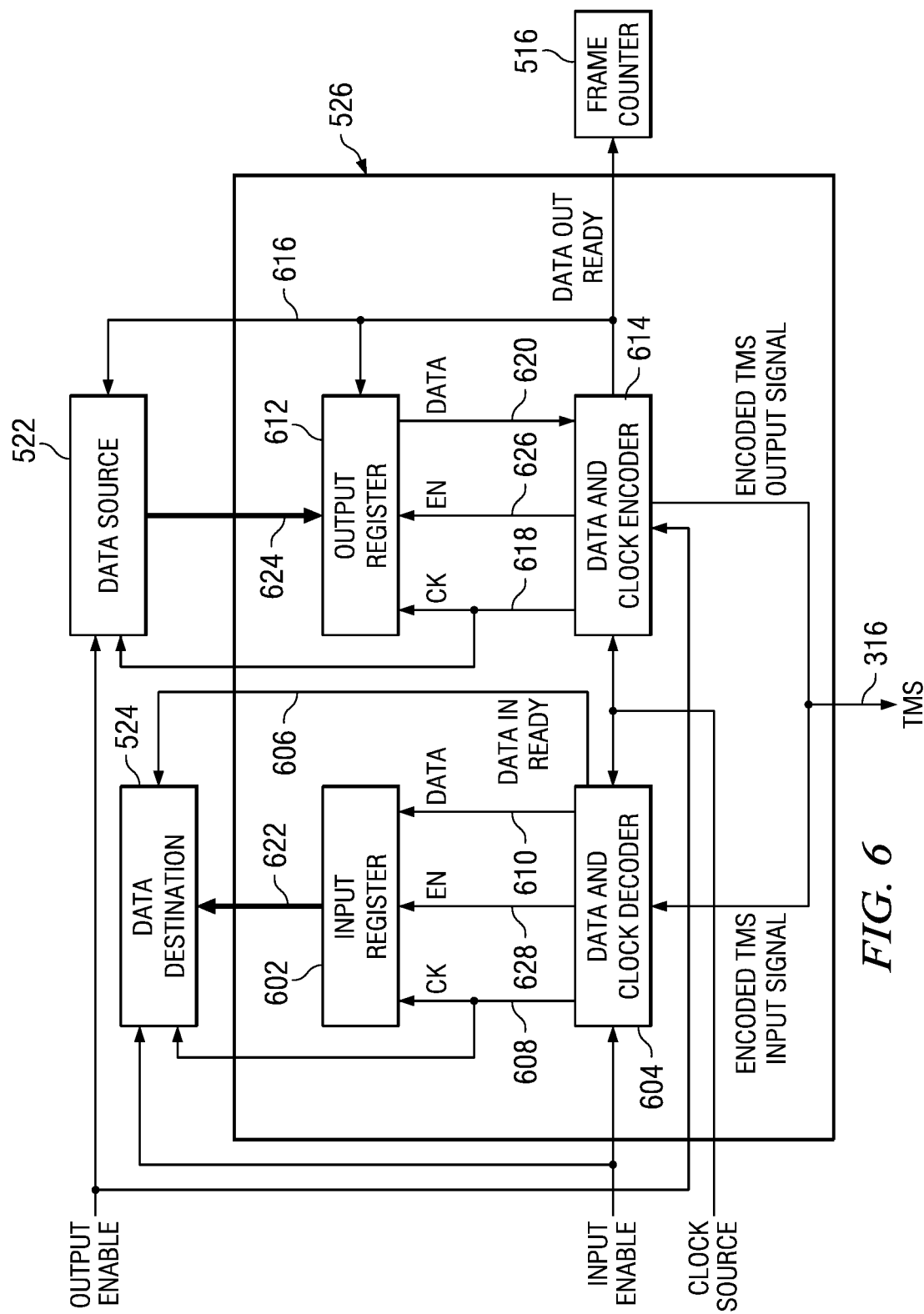
FIG. 6 illustrates the TMS I/O Circuit of FIG. 5 according to the present disclosure.

FIG. 6 illustrates TMS I/O Circuit 526 in more detail. TMS I/O Circuit consists of a Data & Clock Decoder 604, Input Register 602, Data & Clock Encoder 614, and Output Register 612. As will be described in more detail later, the TMS communication is based on Manchester data communication whereby the clock and data signals are combined and transmitted together on TMS.

The function of the Data & Clock Decoder 604 is to receive a frame of Manchester encoded data on TMS terminal 316, extract the data 606 and clock (CK) 608 components from the encoded data, and input the data 606 serially to Input Register 602 in response to the extract CK signal 608. Enable (EN) signal 628 enables Input Register 602 to receive the data 606. Input Register 602, once filled with a complete serial data frame, outputs the data frame in parallel to Data Destination 524 via data bus 622. CK signal 608 and Data In Ready control signal 606 controls the Data Destination to receive the parallel data from bus 622. This process of receiving Manchester encoded serial data frames from TMS terminal 316, decoding the serial data frames into parallel data patterns, and inputting the parallel data patterns to Data Destination 524 is repeated until the TMS input communication operation is completed.

The function of the Data & Clock Encoder 614 is to control the Output Register 612, via Enable (EN) 626, CK 618 and Data Output Ready 616 signals, to receive parallel data patterns from the Data Source 522 via bus 624 and output the data serially, via Data signal 620, to the Data & Clock Encoder 614. The Data & Clock Encoder 614 encodes the serial input data 620 with a clock from Clock Source 528 to produce a frame of serial Manchester encoded data to be output on TMS terminal 316. This process of receiving a parallel data pattern from the Data Source 522, converting the parallel data pattern into a frame of serial Manchester encoded data, and outputting the frame of serial Manchester encoded data onto TMS terminal 316 is repeated until all the parallel data patterns from Data Source 522 have been serially transmitted from TMS terminal 316. As seen in FIG. 6, the Data Out Ready signal 616, which controls the input of parallel data patterns from the Data Source to the Output Register is also input to Frame Counter 516 to control the frame count. The count value in the Frame Counter 516 controls the number of parallel data patterns that are output as encoded serial frames from TMS 316. The Frame Counter 516 decrements once per each Data Out Ready signal. As seen in FIG. 5, when the frame count in Frame Counter 516 expires, the Frame Counter halts the TMS serial output operation by setting the count complete (CC) signal low.

FIG. 7 illustrates a timing example of the Data & Clock Decoder circuit 604 receiving Manchester encoded data on TMS terminal 316. Manchester encoding, is well known and operates by sending an encoded signal as a pair of opposite bits. In the timing diagram, each pair of opposite bits are shown within boxes 708. Each box represents a Manchester encoded signal. In one example of Manchester encoding, an encoded logic one is represented by a logic zero bit followed by a logic one bit, and an encoded logic zero is represented by a logic one bit followed by a logic zero bit. An alternate Manchester encoding reverses the polarity of the bit pair for an encoded logic one and encoded logic zero.

As seen the Manchester Decoder circuit 702 in circuit 604, when enabled by Input Enable, becomes operable to receive a first control segment or Start signals 704, four logic ones in this example, from TMS 316. More than two consecutive logic ones is an illegal Manchester bit encode, therefore more than two logic ones can be used as an indication to initialize the Manchester Decoder for receiving serial frames of encoded TMS data. While two Start signals, each comprising two logic ones, are shown in this example, more Start signals may be used if desired. After recognizing the Start signals, the Manchester Decoder receives frames 1-N of Manchester encoded serial data from TMS 316. The Manchester Decoder extracts the Data and CK components from each Manchester encoded bit in the frame and shifts the extracted Data into the Serial Input Parallel Output (SIPO) Register 602. The Enable output from the Manchester Decoder enables the SIPO Register 602 to receive data. After each frame is decoded and shifted into SIPO Register 602, the Manchester Decoder outputs the Data In Ready signal to Data Destination 524. In response to the Data In Ready signal the Data Destination receives (stores and/or processes) the parallel output of Register 602. This process continues until the Manchester Decoder receives Stop signals 706, four logic zeros in this example, from TMS 316. More than two consecutive logic zeros is an illegal Manchester bit encode, therefore more than two logic zeros can be used as an indication to cause the Manchester Decoder to stop receiving serial frames of encoded TMS data. While two Stop signals, each comprising two logic zeroes, are shown in this example, more Stop signals may be used if desired.

Figure 8A:
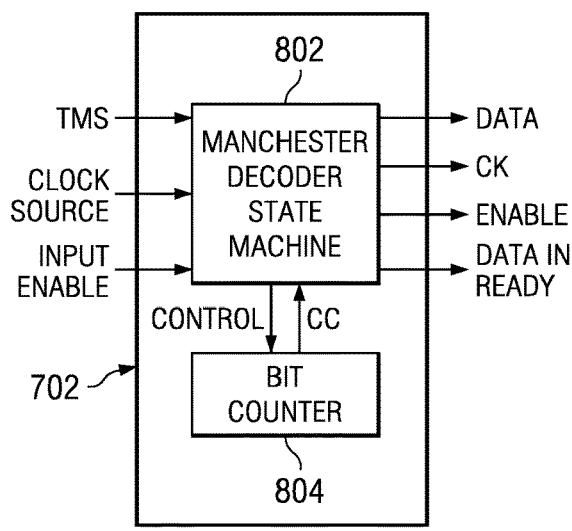
FIG. 8A illustrates a Manchester decoder state machine for receiving encoded TMS data according to the present disclosure.

FIG. 8A illustrates a more detail example of Manchester Decoder circuit 702. The Manchester Decoder 702 consists of a Manchester Decoder State Machine 802 and a Bit Counter 806. The state machine 802 receives the TMS signal from TMS terminal 316, a clock signal from Clock Source 528, the Input Enable signal from And gate 508, and a count complete (CC) signal from Bit Counter 804. The state machine outputs a Data signal to SIPO Register 602, a clock (CK) signal to SIPO Register 602 and Data Destination 524, an Enable signal to SIPO Register 602, the Data In Ready signal to Data Destination 524, count control to Bit Counter 804.

Figure 8B:
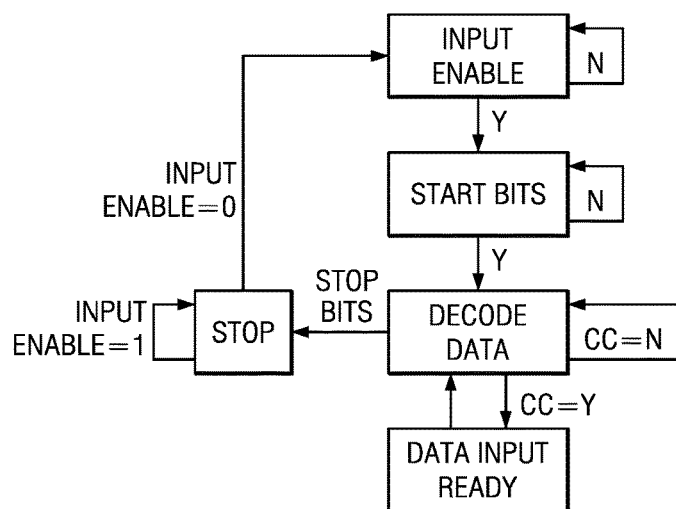
FIG. 8B illustrates a state diagram of the operation of the Manchester decoder state machine of FIG. 8A.

FIG. 8B illustrates the operation of state machine 802. When the Input Enable signal is set high, the state machine begins sampling the TMS input for Start signals 704. The frequency of the Clock Source is set sufficiently high to allow over-sampling of the TMS input signal. After Start signals are detected, the state machine begins sampling the TMS input to decode the Manchester encoded bit pairs 708. Each time a bit pair is decoded, the appropriate Data value is clocked into SIPO Register 602 by the CK signal and the Bit Counter is clocked by counter control outputs. During the decode operation, the state machine monitors the CC input from the counter 804. When a CC signal is detected, indicating that the number of bits received is equal to a full frame of bits, the state machine sets the Data In Ready signal high to enable the Data Destination to receive the full frame of bits from the parallel output from SIPO Register 602. This process continues until the state machine receives the Stop signals 706 on the TMS signal, indicating the end of the transmission of Manchester encoded data frames. The state machine transitions to the Stop state and waits for the Input Enable signal to be set low by the Tap controller 104 exiting the Run Test/Idle state. A subsequent JTAG scan operation to either the DR 108 or the IR 106 register (i.e. the register from which it came) can set the Enable TMS input signal 512 low. When Input Enable goes low, the state machine 802 transitions back to the Input Enable state.

Figure 9:
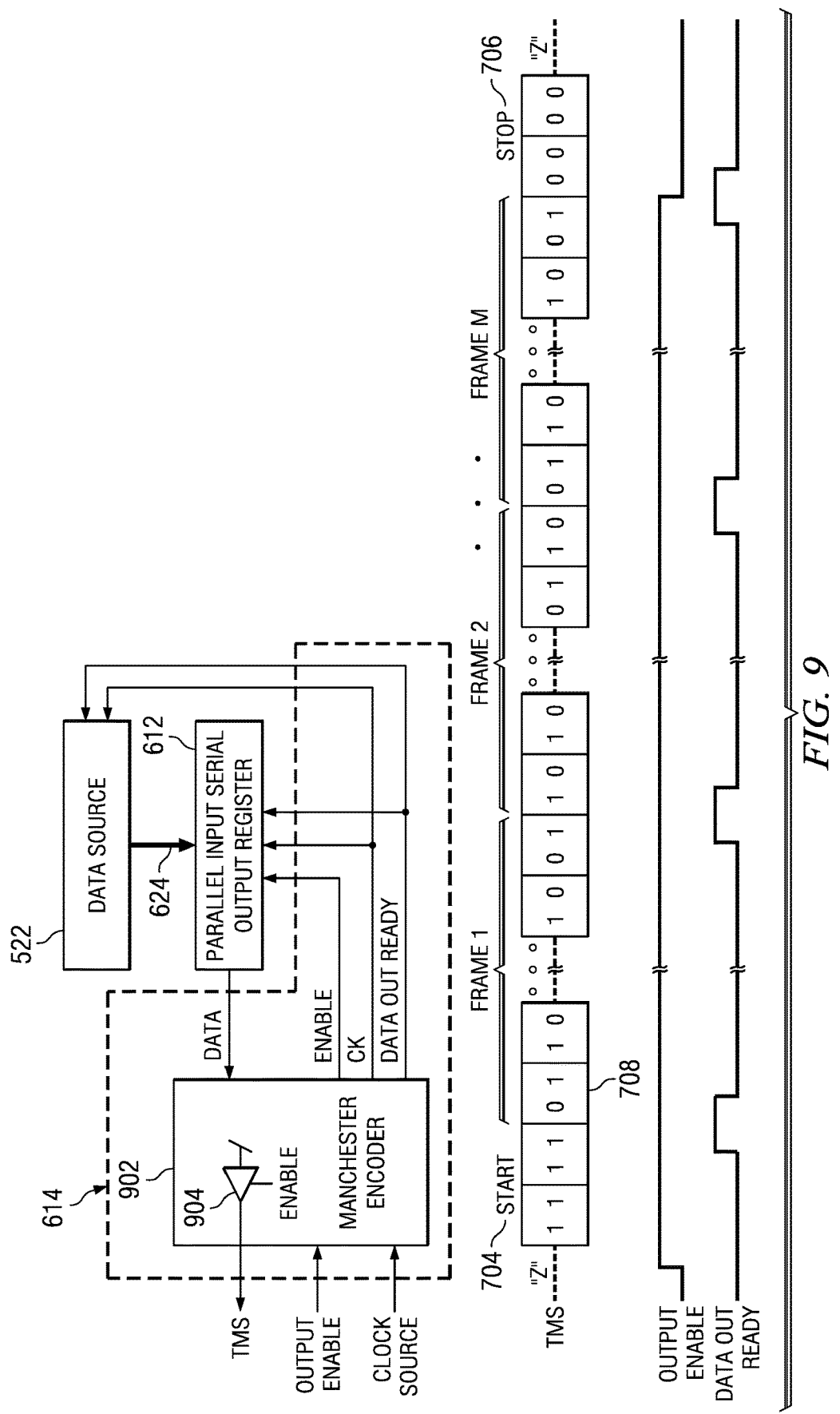
FIG. 9 illustrates circuitry and timing for transmitting Manchester encoded TMS output data according to the present disclosure.

FIG. 9 illustrates a timing example of the Data & Clock Encoder circuit 614 outputting Manchester encoded data on TMS terminal 316. In the timing diagram, each Start 704, Data 708, and Stop 706 bit signals are again illustrated as they were in FIG. 7. As seen the Manchester Encoder circuit 902 in circuit 614, when enabled by Output Enable, becomes operable to transmit Start signals 704, four logic ones in this example, onto TMS 316. Since the TMS terminal of an IC or Core is normally driven by a controller 420, the controller must disable its drive of the TMS terminal to allow the TMS terminal of the IC or Core to become an output to drive the TMS of the controller during TMS output modes of operation. The disabling of the TMS controller output is indicated a "Z" in the timing diagram.

As seen, a 3-state buffer 904 inside the Manchester Encoder 902 becomes enabled during TMS output operation to drive the TMS terminal of the IC or core. After transmitting the Start signals, the Manchester Encoder loads parallel data into the Parallel Input Serial Output (PISO) Register 612 from the Data Source 522 and starts shifting the PISO Register 612. Each bit shifted from the PISO Register to the Manchester Encoder is appropriately encoded as a Manchester bit pair signal 708 and transmitted out of the IC or core via the TMS terminal 316. As seen the transmission of the Manchester bit pairs begins following the last transmitted Start signal. The Manchester Encoder combines the data and clock components together such that a Manchester Decoder 702 in the receiving controller 420 or other IC/core can extract the components back into separate data and clock signals. The Enable output from the Manchester Encoder enables the PISO Register 612 to load and shift out data. The serial data shifted out from one parallel load of the PISO Register forms one serial bit frame. After each frame is shifted out of the PISO Register 612, the Manchester Encoder outputs the Data Out Ready signal to PISO Register 612 and Data Source 522. In response to the Data Out Ready signal the PISO Register 612 inputs parallel data from Data Source 522 to began the next serial output frame that is encoded and output on TMS 316. This process continues until the Output Enable input to the Manchester Encoder goes low, at which time the Manchester Encoder outputs Stop signals 706, four logic zeros in this example, onto TMS 316 and disables the output buffer 904, ending the TMS output operation.

Figure 10A:
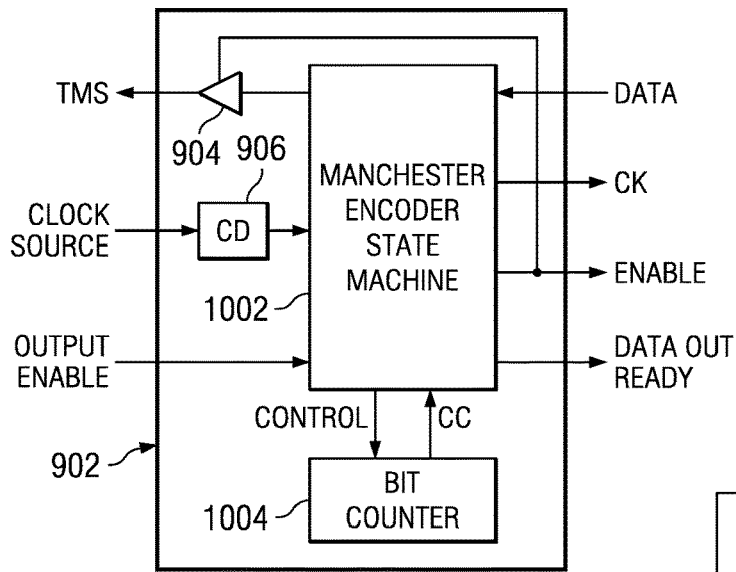
FIG. 10A illustrates a Manchester encoder state machine for transmitting encoded TMS data according to the present disclosure.

FIG. 10A illustrates a more detail example of Manchester Encoder circuit 902. The Manchester Encoder 902 consists of a Manchester Encoder State Machine 1002, Bit Counter 1004, TMS buffer 904, and Clock Divider (CD) 906. The state machine 1002 receives the Data output signal from PISO Register 612, a clock signal from Clock Source 528 via Clock Divider 906, the Output Enable signal from And gate 520, and a count complete (CC) signal from Bit Counter 1004. The state machine outputs a clock (CK) signal to PISO Register 612 and Data Source 522, an Enable signal to PISO Register 612, a Data Out Ready signal to PISO Register 612 and Data Source 522, count control to Bit Counter 1004, and encoded data to TMS 316 via buffer 904.

Figure 10B:
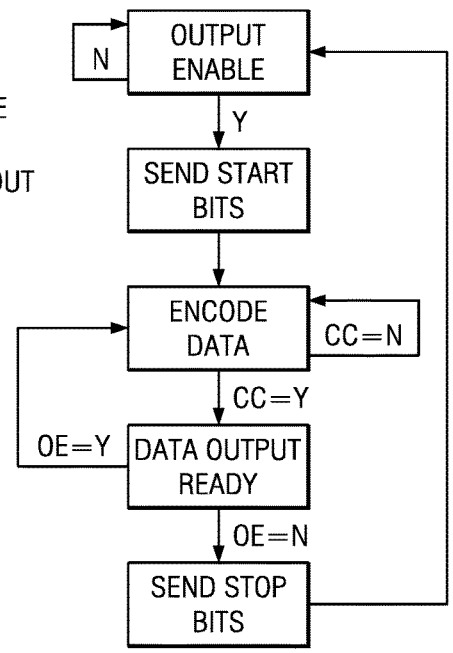
FIG. 10B illustrates a state diagram of the operation of the Manchester encoder state machine of FIG. 10A.

FIG. 10B illustrates the operation of state machine 1002. When the Output Enable signal is set high, the state machine enables the output buffer 904 and outputs Start signals 704 onto TMS 316. Also the first parallel data pattern from Data Source 522 is loaded into PISO Register 612. After sending the Start Bits, the state machine begins encoding the serial output data shifted from PISO Register 612 into Manchester encoded outputs on TMS 316. The frequency of the CK output from the state machine 1002 is sufficiently less than the frequency of the clock output from the Clock Divider 906 to allow each data bit shifted out of PISO Register 612 to be encoded into the appropriate Manchester bit pair signal 708. Each time an encoded bit pair is output on TMS 316, the Bit Counter counts in response to control inputs from state machine 1002. During the encoding operation, the state machine monitors the CC input from the Bit Counter 1004. When a CC signal is detected, indicating that the last bit of the current bit frame is being shifted out of PISO Register 612, the Data Out Ready signal is set to cause the next parallel data pattern from Data Source 522 to be loaded into PISO Register 612 to allow starting the next frame of data bit outputs from the Register 612. Each data bit of each new frame of data loaded and shifted out of PISO Register 612 is encoded into Manchester bit pairs and output on TMS 316. This process continues until the state machine 1002 detects the Output Enable signal going low, as a result of the count in Frame Counter 516 expiring and setting its frame count complete CC signal low, which in turn sets the Output Enable signal low via And gate 520. When Output Enable is detected low, the state machine 1002 outputs the Stop signals 706 to indicate to controller 420 or other IC/core that the transmission of Manchester encoded data frames has come to an end. The state machine then disables output buffer 904 from driving the TMS terminal 316 and transitions to the Output Enable state of the diagram. When the TMS output operation is ended, the controller 420 enables its TMS output, transitions the Tap 104 from the Run Test/Idle state to set the Enable TMS Output signal low by a JTAG scan operation to either the DR 108 or the IR 106 register from whence it came.

Preferably the Clock Sources 528 in the transmitting and receiving devices (i.e. controller 420, IC, or core) are of the same frequency. This would ensure that, by the use of Clock Divider 906 of Manchester Encoder 902, the data encoded and output from a transmitting device's Manchester Encoder 902 will be at a bit rate easily over-sampled and decoded by the non-divided Clock Source 528 driving the Manchester Decoder 702 in a receiving device. A test that TMS data transmitted from Encoder 902 at the divided Clock Source rate is properly received by Decoder 702 at the full Clock Source rate can be achieved by simply enabling both circuits in the same device to operate simultaneously to transmit and receive data over their common TMS connection, then check that the data received in the Data Destination circuit 524 is correct.

As seen in the TMS Manchester communication timing diagrams of FIGS. 7 and 9, the format of a TMS output operation is the same as the format a TMS input operation. Both formats include a header of at least two Start signals 704 followed by frames of Manchester data signals 708 followed by a trailer of at least two Stop signals 706. This allows simple and standardized data communication between a TMS transmitting device (i.e. controller 420, IC, or core) and a TMS receiving device (i.e. controller 420, IC, or core). Other more complex formats may also be implemented as the need arises, such as formats that include frames for addressing and commanding operations to support more sophisticated communication needs.

Figure 11:
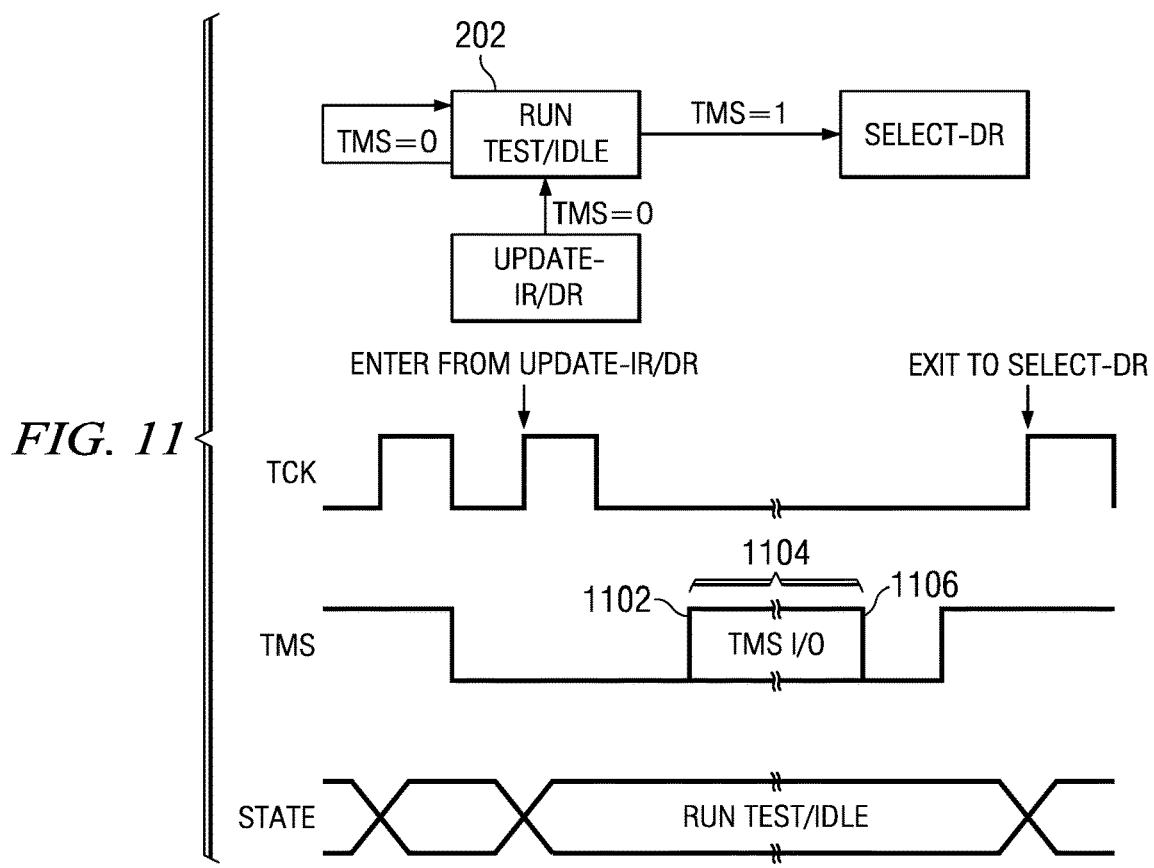
FIG. 11 illustrates how TMS I/O communication can occur while a Tap controller is in the Run Test/Idle state according to the present disclosure.

FIG. 11 illustrates how a TMS I/O operation is initiated by the Tap controller transitioning into the Run Test/Idle state 202. Prior to transitioning into the Run Test/Idle state, a scan operation will have been performed to set the Enable TMS Output 510 or Enable TMS Input 512 signal high, depending upon whether an TMS input or TMS output is desired. Also if it is a TMS output operation, the Frame Counter 516 is loaded with the frame count value. Once this setup procedure is accomplished, the Tap controller 104 is transitioned into the Run Test/Idle state as shown in FIG. 11. Once in the Run Test/Idle state, the TCK clock is halted at a low logic level. The RTI signal is set which enables And Gates 506 and 508 to pass the Enable TMS Input or Output signals 510 and 512 to TMS communication circuit 514. The selected TMS input or TMS output operation begins at time 1102 and is executed during time 1104 as shown in FIG. 11 while the Tap is in the Run Test/Idle state with the TCK halted. When the TMS input or TMS output operation is competed at time 1106, the TMS and TCK signal may once again be operated by the controller 420 to transition the Tap controller 104 through its states. As can be seen, with the Tap controller in the Run Test/Idle state and with the TCK halted, TMS input and TMS output operations are completely transparent to the Tap controller and all IEEE 1149.1 circuitry connected to the Tap controller. While this example halts the TCK at a low logic level, the TCK could be halted at a high logic level as well.

FIG. 12 is provided to illustrate that other Tap controller states, other than Run Test/Idle, may be used to perform TMS input and TMS output operations. For example, the Shift-DR state 1202, the Pause-DR state 1204, the Shift-IR state 1206, and the Pause-IR state 1208 all may be used in addition to the Run Test/Idle state for TMS input and output operation modes. To use these additional Tap controller states as states in which TMS input and output operations may be performed is simply a matter of providing And gates 1210 to decode when the Tap controller is in one of the states, as And gate 504 did for detecting the Run Test/Idle state, and providing an Or gate 1212 for indicating when any of the And gate 1210 outputs are high. The output of the Or gate 1212 would be substituted for the RTI output of And gate 504 in FIG. 5 and input to And gates 506 and 508. With this substitution made, the TCK could be halted in any one of these states to allow the TMS I/O operation to be started, executed, and stopped, as was shown and described in regard to the Run Test/Idle state of FIG. 11. While And/Or gating is shown in this example, other gating circuitry types could be used as well to detect the other Tap states.

Figure 13:
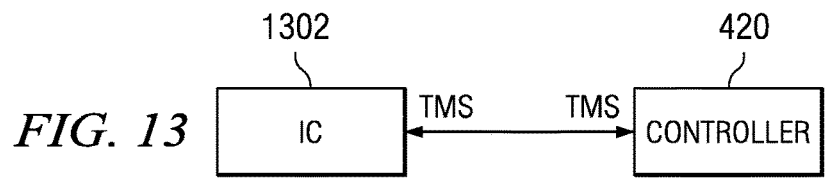
FIG. 13 illustrates TMS I/O communication occurring between and IC and a controller.

FIG. 13 illustrates an example of the TMS I/O operation of the present disclosure being performed between an IC 1302 of a scan path 402 and a controller 420 as shown in FIG. 4. If the controller is performing a TMS output operation, the IC will be performing a TMS input operation to receive the data from the controller via the TMS connection. If the IC is performing a TMS output operation, the controller will be performing a TMS input operation to receive the data from the IC via the TMS connection.

Figure 14:
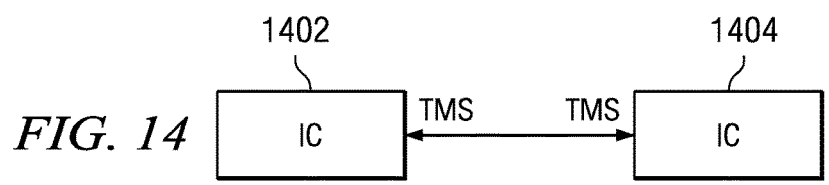
FIG. 14 illustrates TMS I/O communication occurring between two ICs.

FIG. 14 illustrates an example of the TMS I/O operation of the present disclosure being performed between a first 1402 and second 1404 IC of a scan path 402. If IC 1402 is performing a TMS output operation, IC 1404 will be performing a TMS input operation to receive the data from IC 1402 via the TMS connection. If IC 1404 is performing a TMS output operation, IC 1402 will be performing a TMS input operation to receive the data from IC 1404 via the TMS connection. During these operations, the TMS output of controller 420 of FIG. 4 will need to be disabled to allow the TMS terminal of the outputting IC to drive the TMS connection between the ICs.

Figure 15:
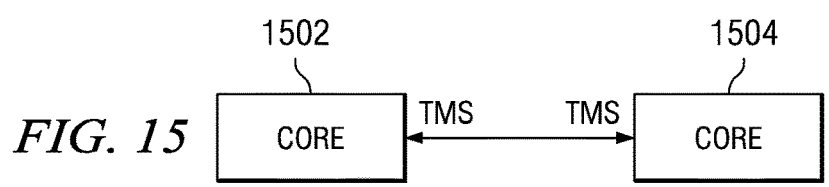
FIG. 15 illustrates TMS I/O communication occurring between two core circuits within an IC.

FIG. 15 illustrates an example of the TMS I/O operation of the present disclosure being performed between a first 1502 and second 1504 core circuit within an IC of scan path 402. If core 1502 is performing a TMS output operation, core 1504 will be performing a TMS input operation to receive the data from core 1502 via the TMS connection. If core 1504 is performing a TMS output operation, core 1502 will be performing a TMS input operation to receive the data from core 1504 via the TMS connection. During these operations, the TMS output of controller 420 of FIG. 4, or the output of an internal buffer in the IC being driven by the TMS output of controller 420 will need to be disabled to allow the TMS terminal of the outputting core to drive the TMS connection between the cores.

In all of the examples in FIGS. 13-15, the TMS I/O data communication between the devices (IC and controller, IC and IC, core and core) is performed directly and without introducing any communication latency by having to pass the communicated data through any other devices. Further, devices not involved in the TMS I/O communication are not affected by the TMS I/O communication.

Figure 16:
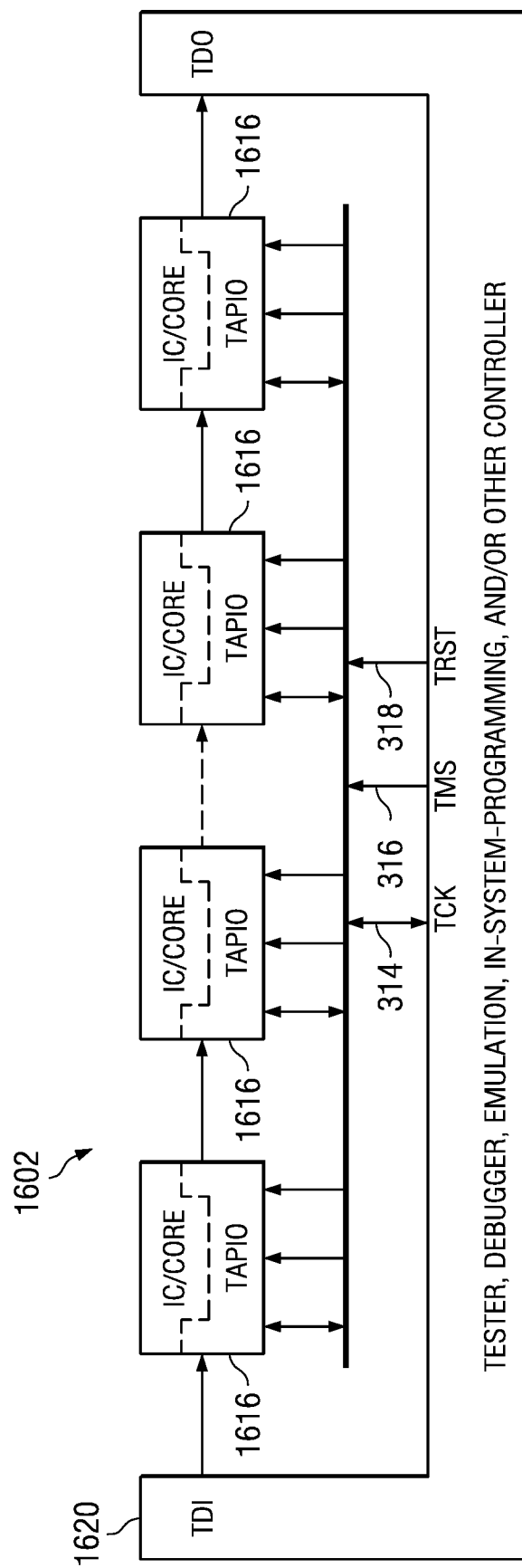
FIG. 16 illustrates the scan path and controller arrangement of FIG. 3 adapted for TCK I/O communication according to the present disclosure.

FIG. 16 illustrates a scan path system 1602 of ICs/cores that include Tap domains plus additional TCK I/O circuitry. The combination of the Tap domain and TCK I/O circuitry is referred to as TAPIO 1616. FIG. 16 is similar to FIGS. 3 and 4 in regard to the way the TDI, TDO, TCK, TMS, and TRST signals are coupled between the TAPIOs 1616 and controller 1620. FIG. 16 is different from FIG. 4 in that communication is provided between the controller 1620 and TAPIO 1616 via the TCK signal 314 instead of via the TMS signal 316. Controller 1620 is different from controller 420 of FIG. 4 in that it has been improved according to the present disclosure to include the capability of communicating data to and from the TAPIOs 1616 via the TCK connection. As with controller 420, controller 1620 maintains the conventional ability of controller 320 to communicate the Tap domains of the TAPIOs 1616 using the standard IEEE 1149.1 serial protocol. As seen, the TCK connection between controller 1620 and TAPIOs 1616 is shown as a bidirectional signal path, as opposed to the unidirectional signal path of the TCK connection in FIG. 3. When a TAPIO 1616 is selected for sending data to the controller 1620 according to the present disclosure, the TCK connection will become an output from the TAPIO and an input to the controller. When a TAPIO 1616 is selected for receiving data from the controller 1620 according to the present disclosure, the TCK connection will become an output from the controller and an input to the TAPIO. As can be seen in FIG. 16, data is transferred directly between a selected TAPIO 1616 and controller 1620. Therefore the data latency problem mentioned in regard with FIG. 3 does not exist in FIG. 16.

Additionally, according to the present disclosure, one TAPIO of an IC/core in the scan path may communicate to another TAPIO 1616 of an IC/core in the scan path via the common bidirectional TCK connection. To achieve this mode of operation, the controller 1620 selects one TAPIO to transmit and another TAPIO to receive. The controller then disables its TCK output driver so that the transmitting TAPIO can output on its TCK terminal to send data to the TCK terminal of the receiving TAPIO. Again, the data is directly transferred between the TAPIOs without the aforementioned latency problem.

Figure 17:
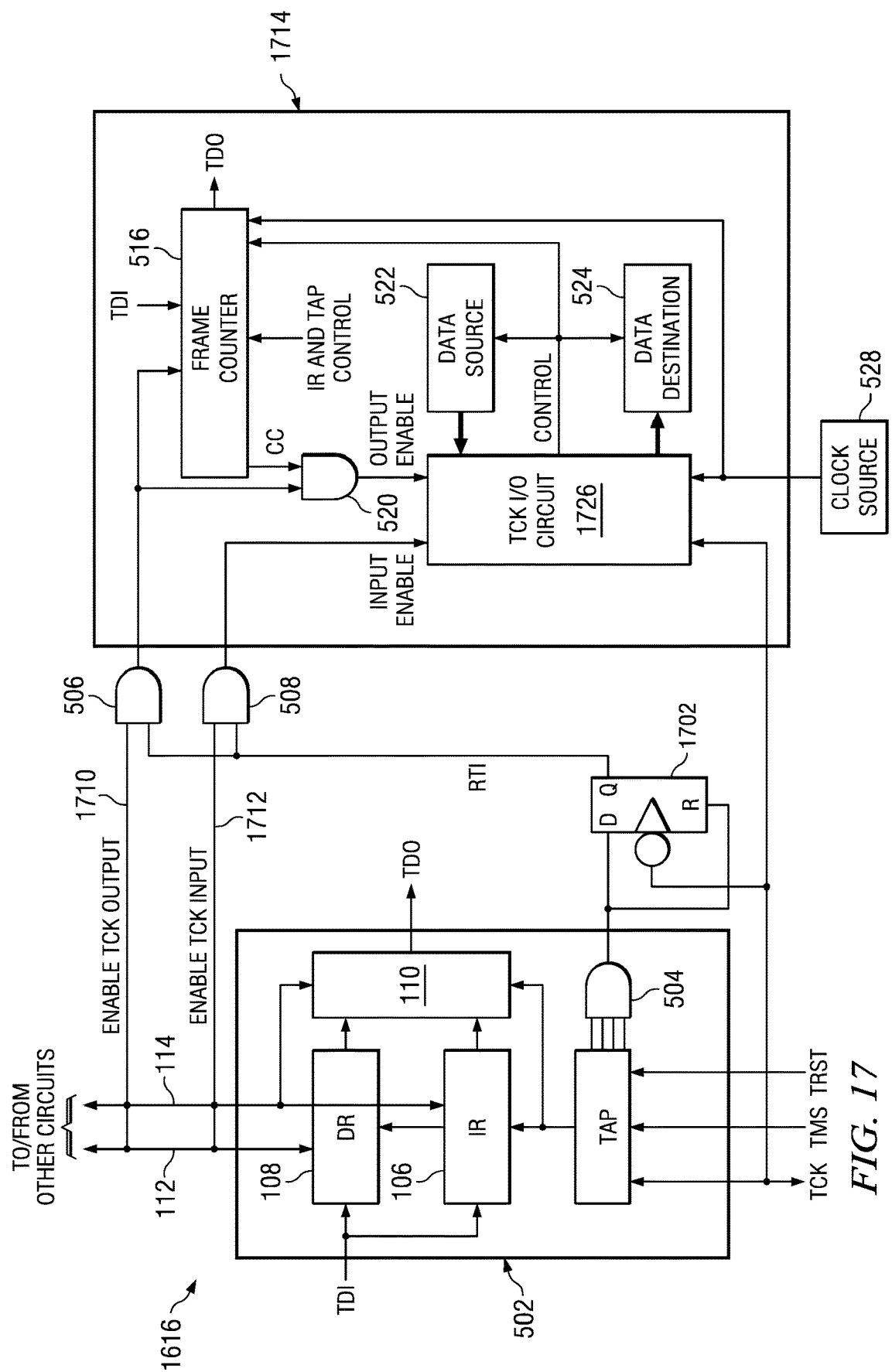
FIG. 17 illustrates TCK I/O communication circuitry coupled to a Tap domain according to the present disclosure.

FIG. 17 illustrates the TAPIO circuit 1616 in more detail. As seen the TAPIO 1616 consists of a Tap domain 502, a TCK communication circuit 1714, And gates 506-508, a Clock Source circuit 528, and a D flip flop 1702. The Clock Source 528 can be a clock producing circuit within the IC or it can come from a pin of the IC. Tap domain 502 is similar to Tap domain 102 with the exception that it includes the previously described And gate 504 for detecting when the Tap controller 104 is in the Run Test/Idle (RTI) state 202 of FIG. 2, and that it includes an Enable TCK Output signal 1710 and an Enable TCK Input signal 1712. D flip flop 1702 has a data (D) input and a reset (R) input coupled to the output of And gate 504, an inverted clock input coupled to TCK 314, and a data (Q) output (RTI) coupled to an input of And gates 506 and 508. The Enable TCK Output signal is set whenever the TCK communication circuit 1714 is to perform a data output operation on TCK. The Enable TCK Input signal is set whenever the TCK communication circuit 1714 is to perform a data input operation on TCK. As seen, the Enable TCK Input or Enable TCK Output signals can come, by design choice, from either the IR 106 via bus 114 or from a DR 108 via bus 112.

When the Tap controller 104 is in the Run Test/Idle state 202 the output of And gate 504 will be high, placing a logic one on the data input and the reset input of D flip flop 1702. With the Tap controller in Run Test/idle, the RTI output of D flip flop 1702 will go high on the falling edge of TCK via the logic one output from And gate 504. When the Tap controller exits from the Run Test/Idle state, the RTI output of And gate 504 goes low by the output of And gate 504 going low, which resets the RTI output of D flip flop 1702 to a logic zero.

When Enable TCK Output is set high and the RTI output of D flip flop 1702 is high, the output of And gate 506 will go high to enable the TCK communications circuit 1714 to perform a TCK output operation. When Enable TCK Input is set high and the RTI output of D flip flop 1702 is high, the output of And gate 508 will go high to enable the TCK communications circuit 1714 to perform a TCK input operation. During either TCK communication operation, the Tap controller 104 remains in the Run Test/Idle state 202 since the TMS signal 316 input from controller 1620 will be held low.

The structure and operation of TCK communication circuit 1714 is the same as TMS communication circuit 514 of FIG. 5 with the exception that TCK I/O Circuit 1726 has been substituted for TMS I/O Circuit 526.

When enabled for inputting data from TCK, the TCK I/O Circuit 1726 receives the TCK data and transfers it to the Data Destination circuitry 524. Data Destination circuitry 524 may be any circuitry within an IC including but not limited to; (1) an address bus, (2) a data bus, (3) a Ram memory, (4) a Cache memory, (5) a register file, (6) a FIFO, (7) a register, (8) a processor, (9) a peripheral circuit, or (10) a bus coupled to circuitry external to the IC.

When enabled for outputting data on TCK, the TCK I/O Circuit 1726 receives data from the Data Source circuitry 522 and outputs the data on TCK. Data Source circuitry 522 may be any circuitry within an IC including but not limited to; (1) an address bus, (2) a data bus, (3) a Ram memory, (4) a Rom memory, (5) a Cache memory, (6) a register file, (7) a FIFO, (8) a register, (9) a processor, (10) a peripheral circuit, or (11) a bus coupled to circuitry external to the IC.

Figure 18:
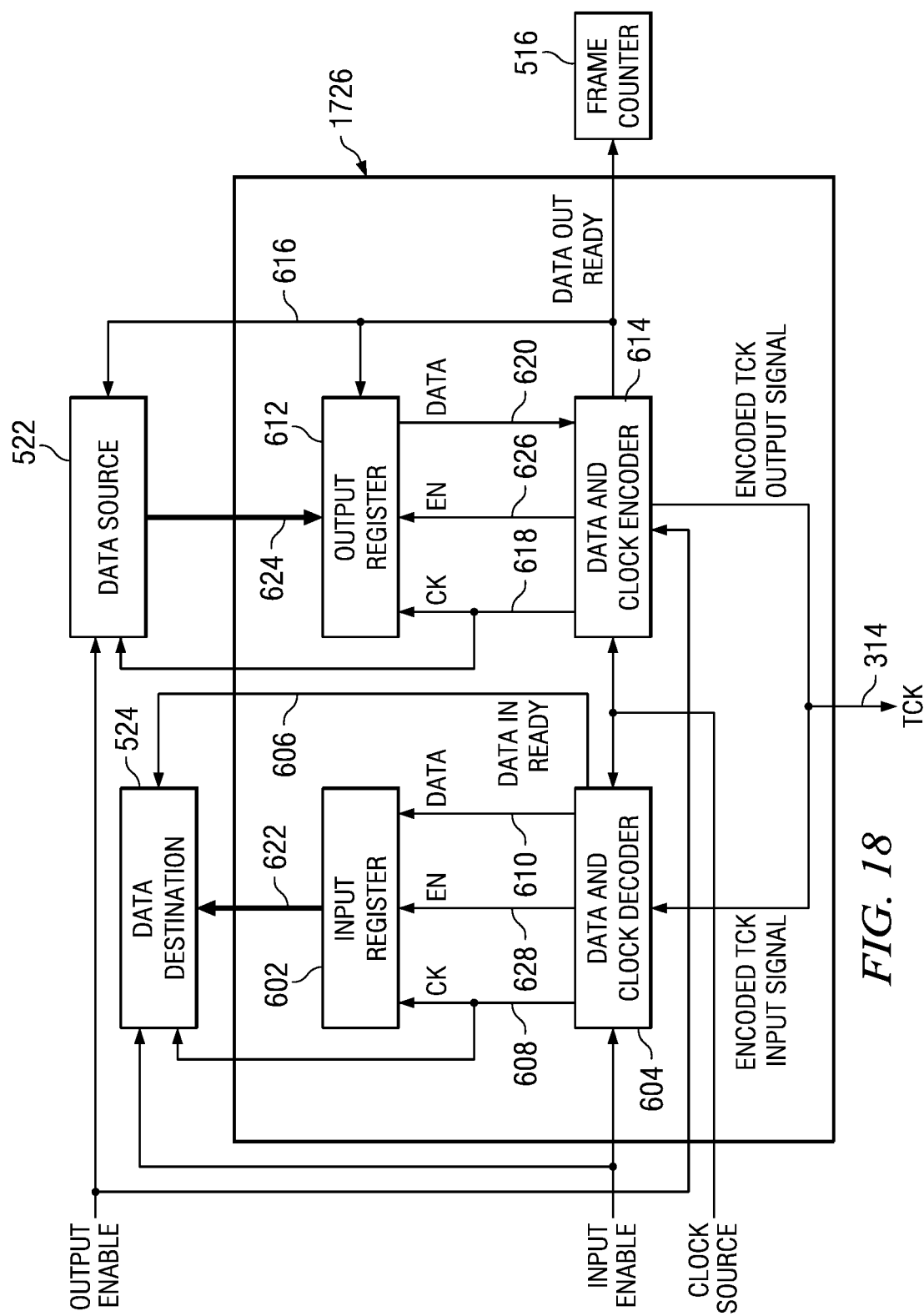
FIG. 18 illustrates the TCK I/O Circuit of FIG. 17 according to the present disclosure.

FIG. 18 illustrates TCK I/O Circuit 1726 in more detail. TCK I/O Circuit 1726 is the same as TMS I/O Circuit 526 of FIG. 6 with the exception that it uses the TCK signal 314 for communication instead of the TMS signal 316.

As described previously in regard to TMS I/O Circuit 526, the function of the Data & Clock Decoder 604 of FIG. 18 is to receive a frame of Manchester encoded data on TCK terminal 314, extract the data and clock (CK) components from the encoded data, and input the data serially to Input Register 602 in response to the extract CK signal. Input Register 602, once filled with a complete serial data frame, outputs the data frame in parallel to Data Destination 524 via data bus 622. CK signal and Data In Ready control signal controls the Data Destination to receive the parallel data from bus 622. This process of receiving Manchester encoded serial data frames from TCK terminal 314, decoding the serial data frames into parallel data patterns, and inputting the parallel data patterns to Data Destination 524 is repeated until the TCK input communication operation is completed.

As described previously in regard to TMS I/O Circuit 526, the function of the Data & Clock Encoder 614 of FIG. 18 is to control the Output Register 612 to receive parallel data patterns from the Data Source 522 via bus 624 and output the data serially to the Data & Clock Encoder 614. The Data & Clock Encoder 614 encodes the serial input data 620 with a clock from Clock Source 528 to produce a frame of serial Manchester encoded data to be output on TCK terminal 314. This process of receiving a parallel data pattern from the Data Source 522, converting the parallel data pattern into a frame of serial Manchester encoded data, and outputting the frame of serial Manchester encoded data onto TCK terminal 314 is repeated until all the parallel data patterns from Data Source 522 have been serially transmitted from TCK terminal 314. As seen in FIG. 18, the Data Out Ready signal 616, which controls the input of parallel data patterns from the Data Source to the Output Register is also input to Frame Counter 516 to control the frame count. The count value in the Frame Counter 516 controls the number of parallel data patterns that are output as encoded serial frames from TCK 316. The Frame Counter 516 decrements once per each Data Out Ready signal. As seen in FIG. 17, when the frame count in Frame Counter 516 expires, the Frame Counter halts the TCK serial output operation by setting the count complete (CC) signal to And gate 520 low.

Figure 19:
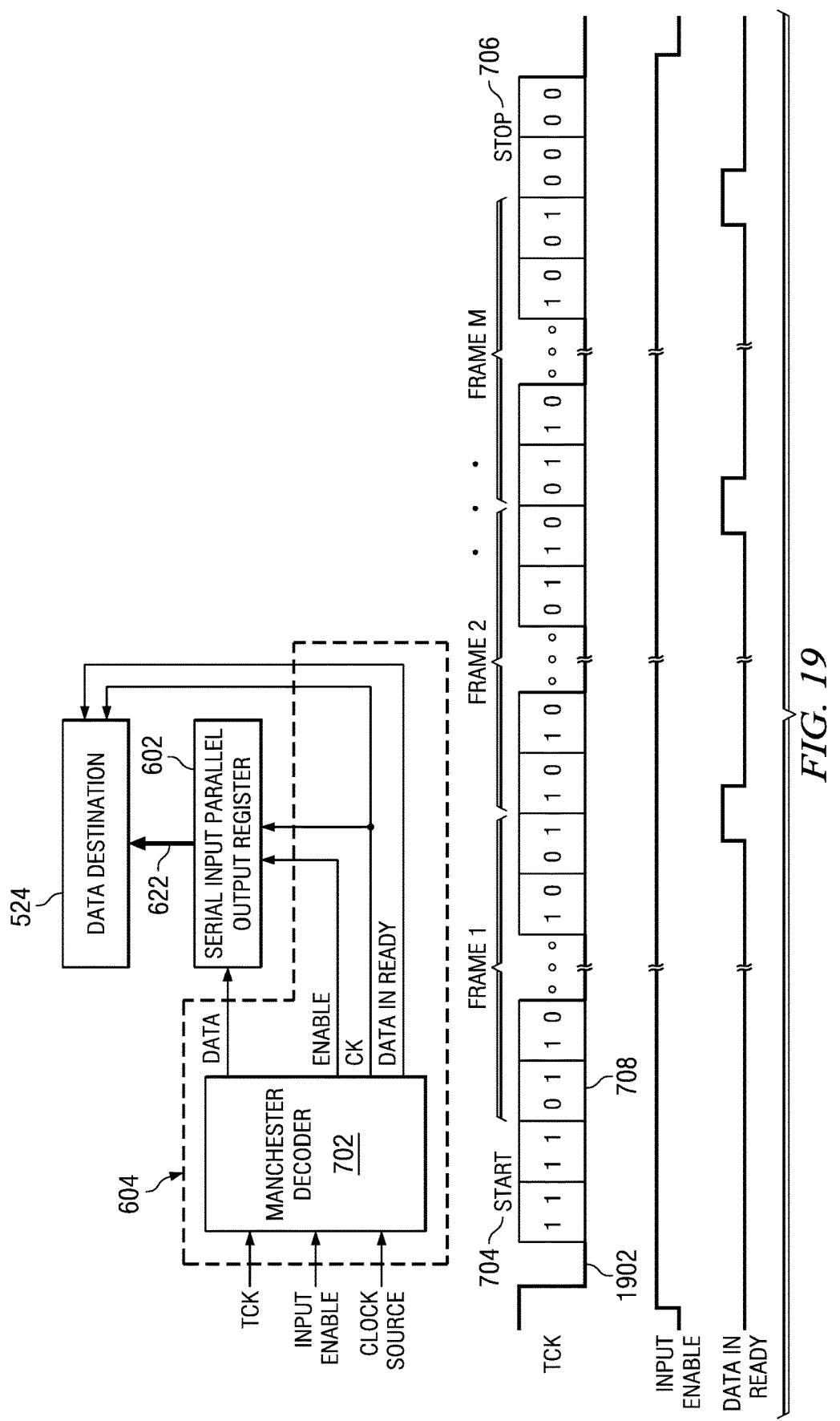
FIG. 19 illustrates circuitry and timing for receiving Manchester encoded TCK input data according to the present disclosure.

FIG. 19 illustrates a timing example of the Data & Clock Decoder circuit 604 receiving Manchester encoded data on TCK terminal 314. The timing example is the same as that described previously in FIG. 7, with the exception that the TCK signal 314 is used for communication instead of the TMS signal 316. Also it is seen that the Input Enable goes high on the falling edge 1902 of TCK 314. Referring back to FIG. 17, the output of D flip flop 1702 is set high on the falling edge of TCK 314 when the Tap is in the RTI state 202, which in turn sets the Input Enable output of And gate 508 high if Enable TCK Input 1712 is high. Use of the falling edge of TCK to initiate the TCK input operation allows the operation to start after TCK has transitioned to a low logic state which allows the Start signals 704 (four logic one's in this example) on TCK to be more easily recognized by the Data & Clock Decoder circuit 604.

As seen the Manchester Decoder circuit 702 in circuit 604, when enabled by Input Enable, becomes operable to receive Start signals 704, four logic ones in this example, from TCK 316. After recognizing the Start signals, the Manchester Decoder receives frames 1-N of Manchester encoded serial data from TCK 314. The Manchester Decoder extracts the Data and CK components from each Manchester encoded bit 708 in the frame and shifts the extracted Data into the Serial Input Parallel Output (SIPO) Register 602. The Enable output from the Manchester Decoder enable the SIPO Register 602 to receive data. After each frame is decoded and shifted into SIPO Register 602, the Manchester Decoder outputs the Data In Ready signal to Data Destination 524. In response to the Data In Ready signal the Data Destination receives (stores and/or processes) the parallel output of Register 602. This process continues until the Manchester Decoder receives Stop signals 706, four logic zeros in this example, from TCK 314, to cause the Manchester Decoder to stop receiving serial frames of encoded TCK data.

Figure 20A:
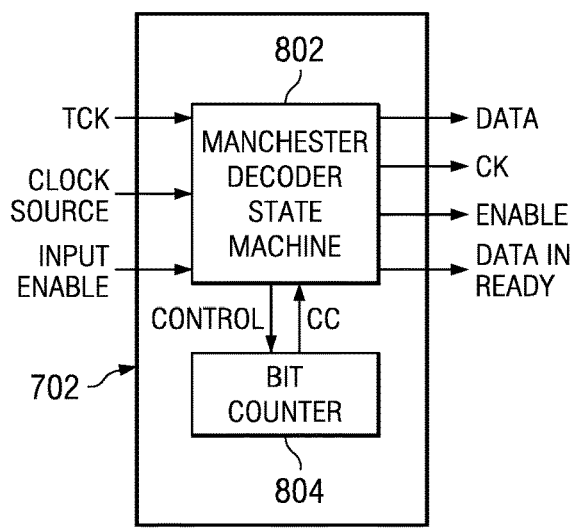
FIG. 20A illustrates a Manchester decoder state machine for receiving encoded TCK data according to the present disclosure.

FIG. 20A illustrates a more detail example of Manchester Decoder circuit 702, which is the same as that described in FIG. 8A with the exception that the TCK signal 314 is substituted for the TMS 316 signal. The Manchester Decoder 702 consists of a Manchester Decoder State Machine 802 and a Bit Counter 806. The state machine 802 receives the TCK signal from TCK terminal 314, a clock signal from Clock Source 528, the Input Enable signal from And gate 508, and a count complete (CC) signal from Bit Counter 804. The state machine outputs a Data signal to SIPO Register 602, a clock (CK) signal to SIPO Register 602 and Data Destination 524, an Enable signal to SIPO Register 602, the Data In Ready signal to Data Destination 524, count control to Bit Counter 804.

Figure 20B:
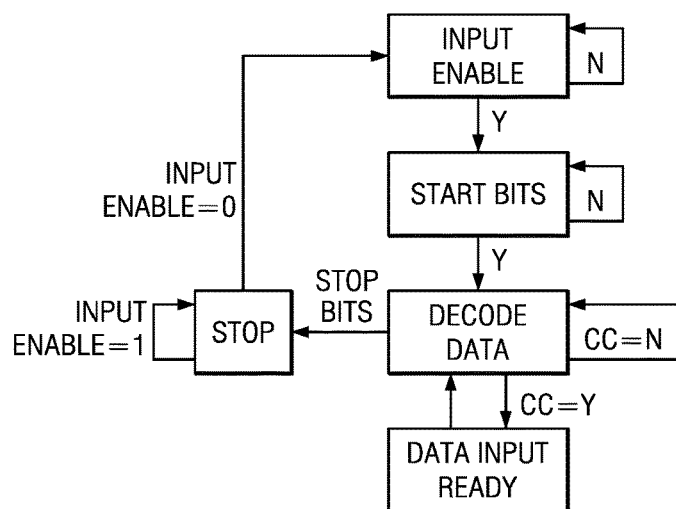
FIG. 20B illustrates a state diagram of the operation of the Manchester decoder state machine of FIG. 20A.

FIG. 20B illustrates the operation of state machine 802, which is the same as described previously in regard to FIG. 8B. When the Input Enable signal is set high, the state machine begins sampling the TCK input for Start signals 704. The frequency of the Clock Source is set sufficiently high to allow over-sampling of the TCK input signal. After Start signals are detected, the state machine begins sampling the TCK input to decode the Manchester encoded bit pairs 708. Each time a bit pair is decoded, the appropriate Data value is clocked into SIPO Register 602 by the CK signal and the Bit Counter is clocked by counter control outputs. During the decode operation, the state machine monitors the CC input from the counter 804. When a CC signal is detected, indicating that the number of bits received is equal to a full frame of bits, the state machine sets the Data In Ready signal high to enable the Data Destination to receive the full frame of bits from the parallel output from SIPO Register 602. This process continues until the state machine receives the Stop signals 706 on the TCK signal, indicating the end of the transmission of Manchester encoded data frames. The state machine transitions to the Stop state and waits for the Input Enable signal to be set low by the Tap controller 104 exiting the Run Test/Idle state. A subsequent JTAG scan operation to either the DR 108 or the IR 106 register (i.e. the register from which it came) can set the Enable TCK input signal 1712 low. When Input Enable goes low, the state machine 802 transitions back to the Input Enable state.

Figure 21:
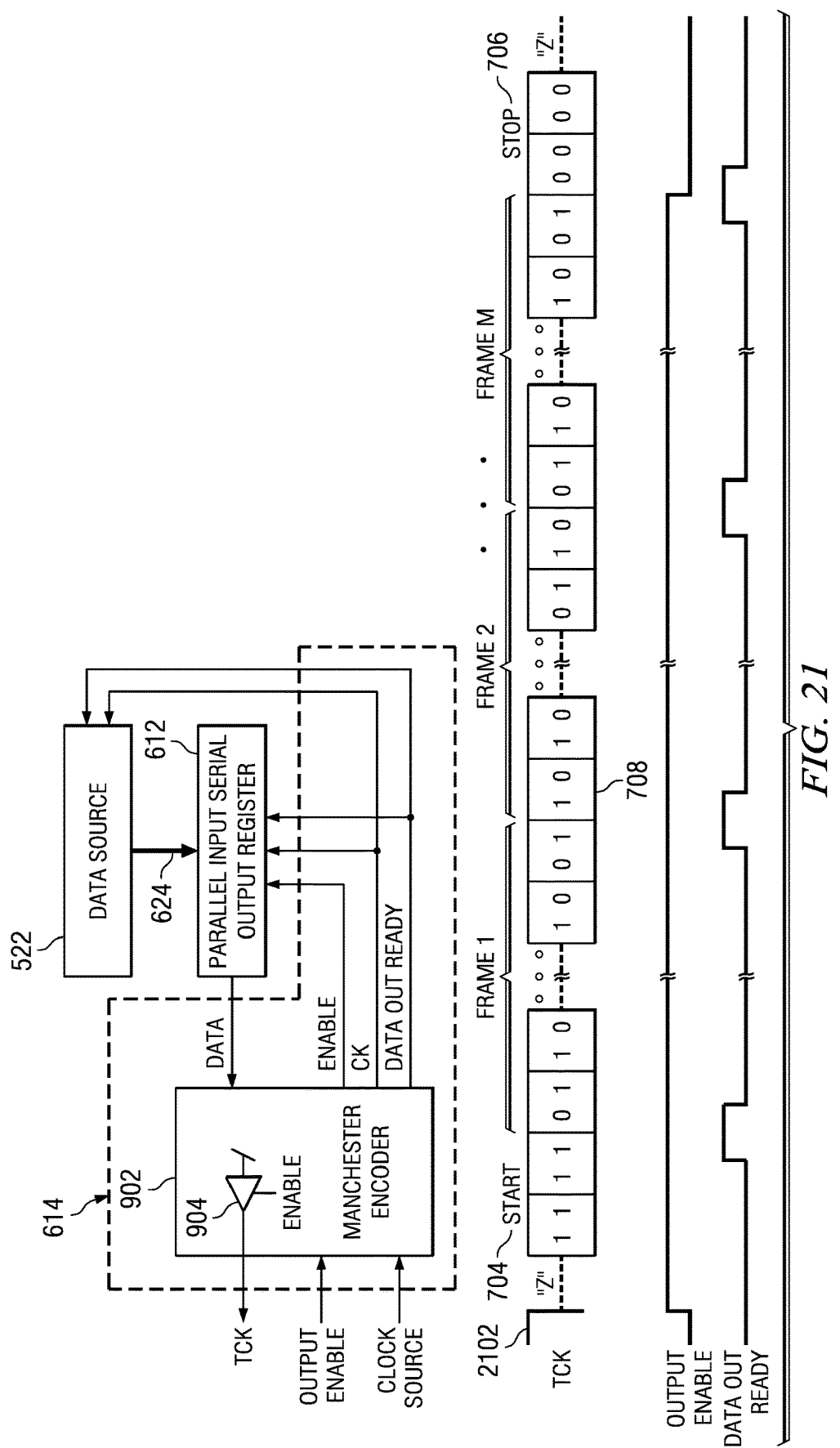
FIG. 21 illustrates circuitry and timing for transmitting Manchester encoded TCK output data according to the present disclosure.

FIG. 21 illustrates a timing example of the Data & Clock Encoder circuit 614 outputting Manchester encoded data on TCK terminal 314. The timing example is the same as that described previously in FIG. 9, with the exception that the TCK signal 314 is used for communication instead of the TMS signal 316. Also it is seen that the Output Enable goes high on the falling edge 2102 of TCK 314. Referring back to FIG. 17, the output of D flip flop 1702 is set high on the falling edge of TCK 314 when the Tap is in the RTI state 202, which in turn sets the Output Enable output of And gate 506 high if Enable TCK Output 1710 is high. Use of the falling edge of TCK to initiate the TCK output operation allows the operation to start after TCK has transitioned to a low logic state and the controller 1620 has disabled ("Z") its TCK output driver.

In the timing diagram, the Start 704, Data 708 (of frames 1-N), and Stop 706 signals are again illustrated as they were in FIG. 9. As seen, the Manchester Encoder circuit 902 in circuit 614, when enabled by Output Enable, becomes operable to transmit Start signals 704, four logic ones in this example, onto TCK 314. As mentioned above, the controller 1620 will have disabled its TCK output driver to allow the output buffer 904 of the Manchester Encoder circuit 902 to drive the TCK 314 terminal.

After transmitting the Start signals, the Manchester Encoder loads parallel data into the Parallel Input Serial Output (PISO) Register 612 from the Data Source 522 and starts shifting the PISO Register 612. Each bit shifted from the PISO Register to the Manchester Encoder is appropriately encoded as a Manchester bit pair signal 708 and transmitted out of the IC or core via the TCK terminal 314. The Manchester Encoder combines the data and clock components together such that a Manchester Decoder 702 in the receiving controller 420 or other IC/core can extract the components back into separate data and clock signals. The Enable output from the Manchester Encoder enables the PISO Register 612 to load and shift out data. The serial data shifted out from one parallel load of the PISO Register forms one serial bit frame. After each frame is shifted out of the PISO Register 612, the Manchester Encoder outputs the Data Out Ready signal to PISO Register 612 and Data Source 522. In response to the Data Out Ready signal the PISO Register 612 inputs parallel data from Data Source 522 to began the next serial output frame that is encoded and output on TCK 314. This process continues until the Output Enable input to the Manchester Encoder goes low, at which time the Manchester Encoder outputs Stop signals 706, four logic zeros in this example, onto TCK 314 and disables the output buffer 904, ending the TCK output operation.

Figure 22A:
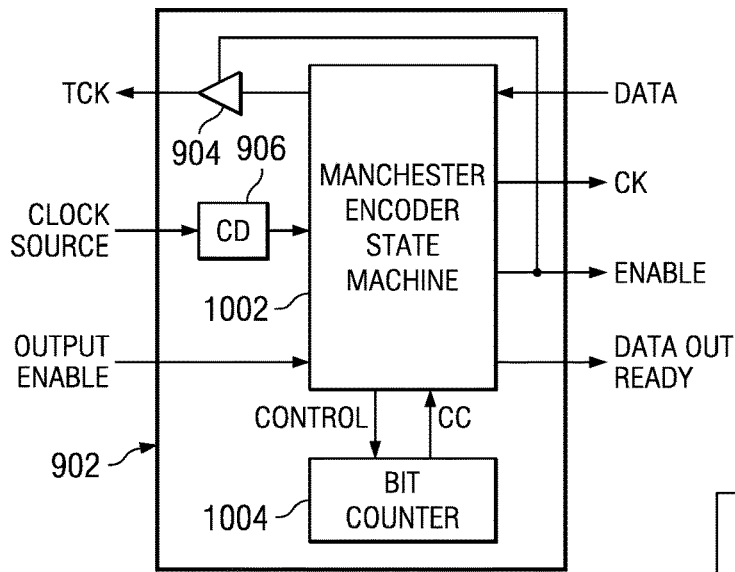
FIG. 22A illustrates a Manchester encoder state machine for transmitting encoded TCK data according to the present disclosure.

FIG. 22A illustrates a more detail example of Manchester Encoder circuit 902, which is the same as that described in FIG. 10A with the exception that the TCK signal 314 is substituted for the TMS 316 signal. The Manchester Encoder 902 consists of a Manchester Encoder State Machine 1002, Bit Counter 1004, TCK buffer 904, and Clock Divider (CD) 906. The state machine 1002 receives the Data output signal from PISO Register 612, a clock signal from Clock Source 528 via Clock Divider 906, the Output Enable signal from And gate 520, and a count complete (CC) signal from Bit Counter 1004. The state machine outputs a clock (CK) signal to PISO Register 612 and Data Source 522, an Enable signal to PISO Register 612, a Data Out Ready signal to PISO Register 612 and Data Source 522, count control to Bit Counter 1004, and encoded data to TCK 314 via buffer 904.

Figure 22B:
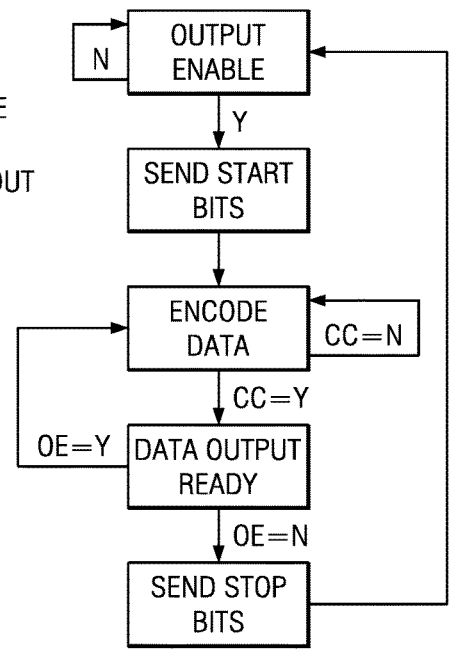
FIG. 22B illustrates a state diagram of the operation of the Manchester encoder state machine of FIG. 22A.

FIG. 22B illustrates the operation of state machine 1002. When the Output Enable signal is set high, the state machine enables the output buffer 904 and outputs Start signals 704 onto TCK 314. Also the first parallel data pattern from Data Source 522 is loaded into PISO Register 612. After sending the Start Bits, the state machine begins encoding the serial output data shifted from PISO Register 612 into Manchester encoded outputs on TCK 314. The frequency of the CK output from the state machine 1002 is sufficiently less than the frequency of the clock output from the Clock Divider 906 to allow each data bit shifted out of PISO Register 612 to be encoded into the appropriate Manchester bit pair signal 708. Each time an encoded bit pair is output on TCK 314, the Bit Counter counts in response to control inputs from state machine 1002. During the encoding operation, the state machine monitors the CC input from the Bit Counter 1004. When a CC signal is detected, indicating that the last bit of the current bit frame is being shifted out of PISO Register 612, the Data Out Ready signal is set to cause the next parallel data pattern from Data Source 522 to be loaded into PISO Register 612 to allow starting the next frame of data bit outputs from the Register 612. Each data bit of each new frame of data loaded and shifted out of PISO Register 612 is encoded into Manchester bit pairs and output on TCK 314. This process continues until the state machine 1002 detects the Output Enable signal going low, as a result of the count in Frame Counter 516 expiring and setting its frame count complete CC signal low, which in turn sets the Output Enable signal low via And gate 520. When Output Enable is detected low, the state machine 1002 outputs the Stop signals 706 to indicate to controller 1620 or other IC/core that the transmission of Manchester encoded data frames has come to an end. The state machine then disables output buffer 904 from driving the TCK terminal 314 and transitions to the Output Enable state of the diagram. When the output operation is ended, the controller 1620 enables its TCK output and sets the Enable TCK Output signal low by a JTAG scan operation to either the DR 108 or the IR 106 register from whence it came.

As with the TMS I/O communication, it is preferable that the Clock Sources 528 in transmitting and receiving devices (i.e. controller 1620, IC, or core) be at the same frequency. This would ensure that, by the use of Clock Divider 906 of Manchester Encoder 902, the data encoded and output from a transmitting device's Manchester Encoder 902 will be at a bit rate easily over-sampled and decoded by the non-divided Clock Source 528 driving the Manchester Decoder 702 in a receiving device. A test that TCK data transmitted from Encoder 902 at the divided Clock Source rate is properly received by Decoder 702 at the full Clock Source rate can be achieved by performing the test previously describe with the TMS I/O communication.

As seen in the TCK Manchester communication timing diagrams of FIGS. 19 and 21, the format of a TCK output operation is the same as the format a TCK input operation. Both formats include a header of Start signals 704 followed by frames of Manchester data signals 708 followed by a trailer of Stop signals 706. This allows simple and standardized data communication between a TCK transmitting device (i.e. controller 1620, IC, or core) and a TCK receiving device (i.e. controller 1620, IC, or core). As with the previously described TMS communication of FIGS. 7 and 9, TCK communication may be expanded to include other more complex formats as the need arises, such as formats that include frames for addressing and commanding operations.

Figure 23:
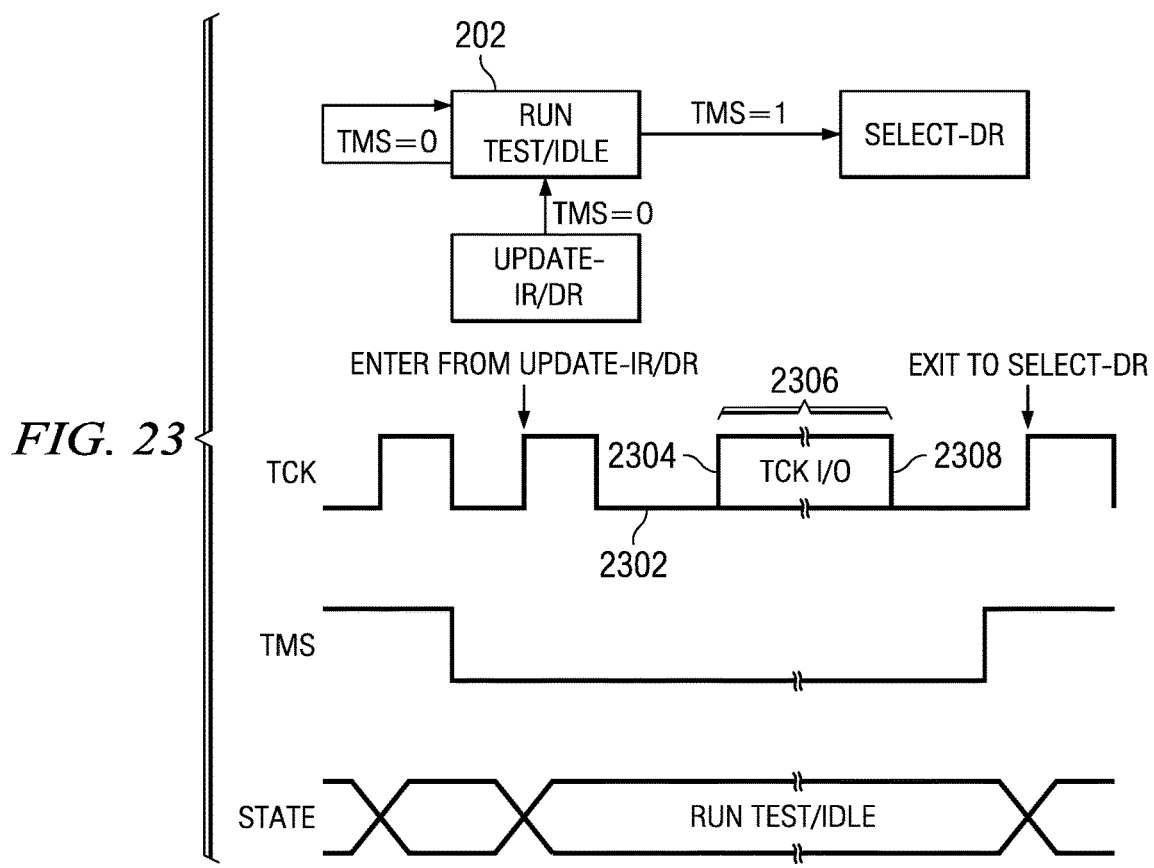
FIG. 23 illustrates how TCK I/O communication can occur while a Tap controller is in the Run Test/Idle state according to the present disclosure.

FIG. 23 illustrates how a TCK I/O operation is initiated by the Tap controller transitioning into the Run Test/Idle state 202. Prior to transitioning into the Run Test/Idle state, a scan operation will have been performed to set the Enable TCK Output 1710 or Enable TCK Input 1712 signal high, depending upon whether a TCK input or TCK output is desired. Also if it is a TCK output operation, the Frame Counter 516 is scanned to load the frame count value. Once this setup procedure is accomplished, the Tap controller 104 is transitioned into the Run Test/Idle state as shown in FIG. 23. Once in the Run Test/Idle state, and after the RTI output of D flip flop 1702 goes high, the selected TCK input or output operation can begin.

The RTI signal is set high on the falling edge of TCK at time 2302 which enables And Gates 506 and 508 to pass the Enable TCK Input or Output signals 1710 and 1712 to TCK communication circuit 1714. If a TCK output operation is to be performed, the controller 1620 will disable its TCK output driver after the falling edge of TCK at time 2302 and before time 2304 to allow a transmitting device to drive the TCK signal 314. The selected TCK input or TCK output operation begins at time 2304 and is executed during time 2306 as shown in FIG. 23 while the Tap is in the Run Test/Idle state. When the TCK input or TCK output operation is competed at time 2308, the TCK signal may once again be driven by the controller 1720 to conventionally operate Tap controller 104 using IEEE 1149.1 protocols. As can be seen, with the Tap controller in the Run Test/Idle state with TMS held low, TCK input and TCK output operations are completely transparent to the Tap controllers and all IEEE 1149.1 circuitry connected to Tap controllers.

Figure 24:
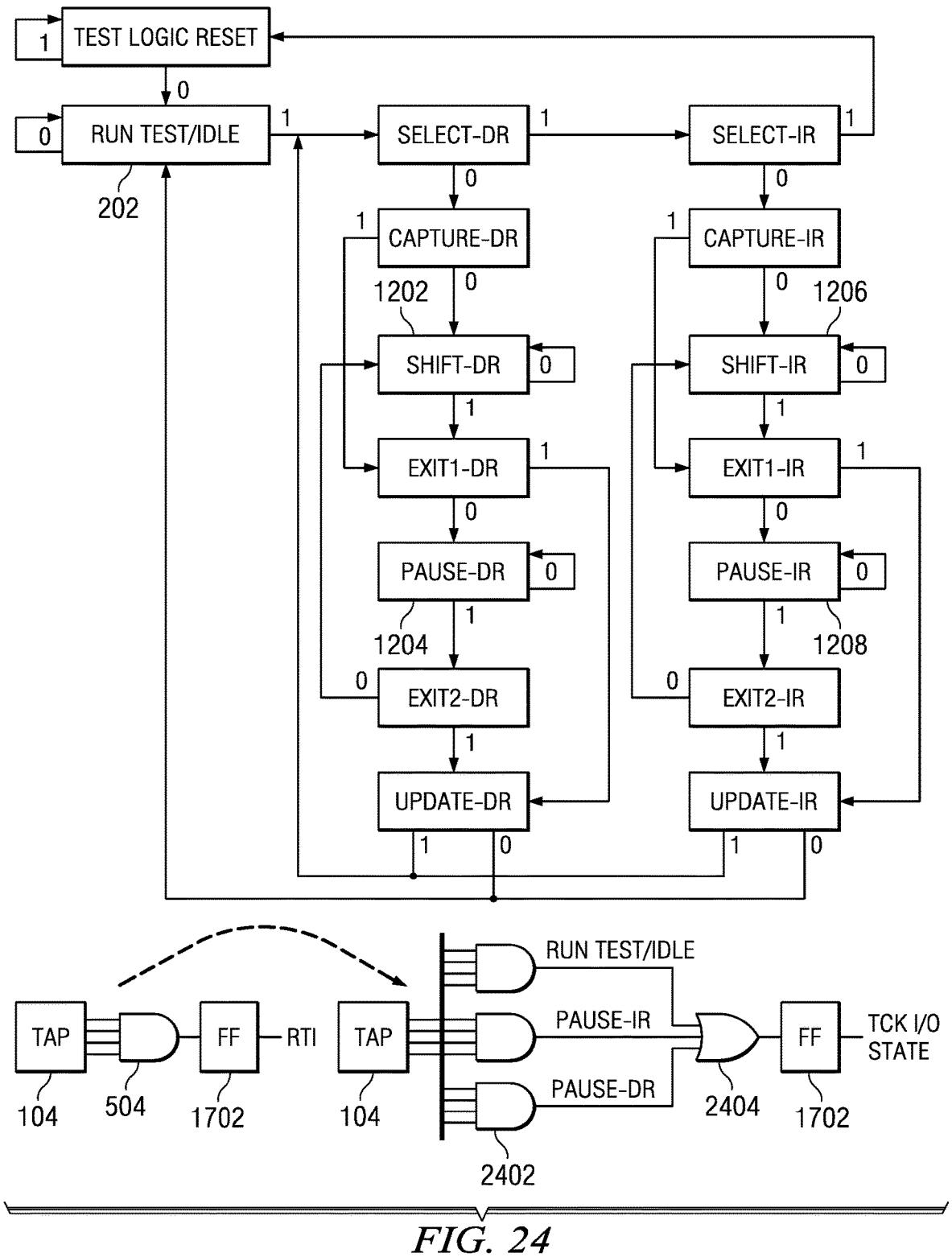
FIG. 24 illustrates how TCK I/O communication may occur while a Tap controller is in other states according to the present disclosure.

FIG. 24 is provided to illustrate that other Tap controller states, other than Run Test/Idle, may be used to perform TCK input and TCK output operations. For example, the Pause-DR state 1204 or the Pause-IR state 1208 may be used in addition to the Run Test/Idle state 202 for TCK input and output operation modes. To use these additional Tap controller states as states in which TCK input and output operations may be performed is simply a matter of providing And gates 2402 to detect when the Tap controller is in one of the states, as And gate 504 did for detecting the Run Test/Idle state, and providing an Or gate 2404 for indicating when any of the And gate 2402 outputs are high. The output of the Or gate 2404 would be substituted for the output of And gate 504 in FIG. 17 as input to D flip flop 1702. The output of D flip flop 1702, renamed "TCK I/O State" in FIG. 24, would maintain its connection to And gate 506 and 508 as shown in FIG. 17. With this substitution made, the Tap controller 104 could be transitioned into any one of these states, and held there by asserting a low on TMS, to allow a TCK I/O operation to be started, executed, and stopped, as was shown and described in regard to the Run Test/Idle state of FIG. 23. While it is possible to also use the Shift-DR state 1202 and Shift-IR state 1206 for TCK input and output operations, as was shown and described in the TMS input and output operations of FIG. 12, one must be aware that data will be shifting through the ICs/cores of scan path 1602 from TDI to TDO during the TCK input or output operations, since the TCK signal will be active. This may or may not be a desired situation and is therefore left up to the user of the disclosure to determined whether TCK input and output operations are also allowed in the Shift-DR and Shift-IR Tap states. If allowed, then additional And gates 2402 would be assigned to detect these additional Tap states and the Or gate 2404 would be equipped with additional inputs for receiving the outputs from the additional And gates 2402.

Figure 25:
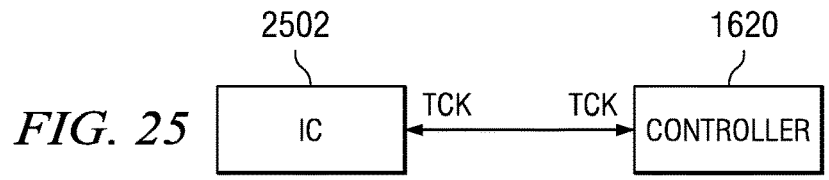
FIG. 25 illustrates TCK I/O communication occurring between and IC and a controller.

FIG. 25 illustrates an example of the TCK I/O operation of the present disclosure being performed between an IC 2502 of a scan path 1602 and a controller 1620 as shown in FIG. 16. If the controller is performing a TCK output operation, the IC will be performing a TCK input operation to receive the data from the controller via the TCK connection. If the IC is performing a TCK output operation, the controller will be performing a TCK input operation to receive the data from the IC via the TCK connection.

Figure 26:
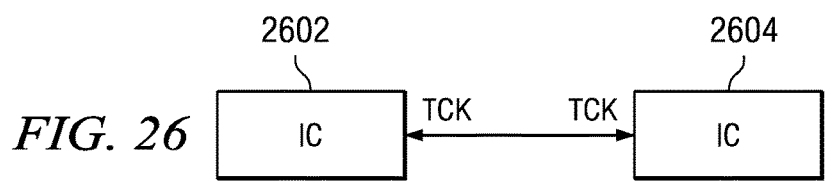
FIG. 26 illustrates TCK I/O communication occurring between two ICs.

FIG. 26 illustrates an example of the TCK I/O operation of the present disclosure being performed between a first 2602 and second 2604 IC of a scan path 1602. If IC 2602 is performing a TCK output operation, IC 2604 will be performing a TCK input operation to receive the data from IC 2602 via the TCK connection. If IC 2604 is performing a TCK output operation, IC 2602 will be performing a TCK input operation to receive the data from IC 2604 via the TCK connection. During these operations, the TCK output of controller 1620 of FIG. 16 will need to be disabled to allow the TCK terminal of the outputting IC to drive the TCK connection between the ICs.

Figure 27:
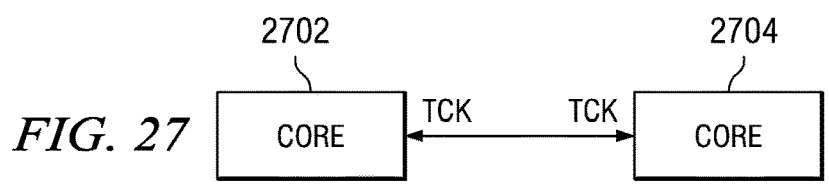
FIG. 27 illustrates TCK I/O communication occurring between two core circuits within an IC.

FIG. 27 illustrates an example of the TCK I/O operation of the present disclosure being performed between a first 2702 and second 2704 core circuit within an IC of scan path 1602. If core 2702 is performing a TCK output operation, core 2704 will be performing a TCK input operation to receive the data from core 2702 via the TCK connection. If core 2704 is performing a TCK output operation, core 2702 will be performing a TCK input operation to receive the data from core 2704 via the TCK connection. During these operations, the TCK output of controller 1620 of FIG. 16, or the output of an internal buffer in the IC being driven by the TCK output of controller 1620 will need to be disabled to allow the TCK terminal of the outputting core to drive the TCK connection between the cores.

In all of the examples in FIGS. 25-27, the TCK I/O data communication between the devices (IC and controller, IC and IC, core and core) is performed directly and without introducing any communication latency by having to pass the communicated data through any other devices. Further, devices not involved in the TCK I/O communication are not affected by the TCK I/O communication.

While the Manchester encoding and decoding circuits described herein to achieve the TMS and TCK I/O communication have been described as being state machines operating synchronous to a clock source 528, the disclosure is not limited to a particular type of Manchester encoding and decoding circuit. Indeed, other types of Manchester encoding and decoding circuits may be readily substituted for the example circuits shown herein and used to achieve the Manchester based TMS and TCK I/O communication objective of the present disclosure.

While the TMS and TCK I/O communication circuit examples were shown as residing in ICs and/or cores, it should be clear that similar TMS and TCK I/O communication circuits or software that can emulate the TMS and TCK I/O communication circuit functionality also resides in the controllers that connect to the ICs and/or cores to enable the controllers to communicate with the ICs and/or cores during TMS and TCK I/O communication operations.

Although the present disclosure has been described in detail, it should be understood that various changes, substitutions and alterations may be made without departing from the spirit and scope of the disclosure as defined by the appended claims.

What is claimed is:

1. Communication circuitry comprising:
    (a) a test data in input, a bi-directional test mode select terminal, a test clock input, and a test data out output;
    (b) test access port circuitry including test controller circuitry coupled to the test mode select terminal and the test clock input;
    (c) serial communication circuitry separate from the test access port circuitry, the serial communication circuitry having a serially accessible register through the bi-directional test mode select terminal; and
    (d) a counter operable to store a value corresponding to repetition of a serial access by the serial communication circuitry.

2. The communication circuitry of claim 1 in which the test access port circuitry includes:
    an instruction register having an input coupled to the test data in input, control inputs coupled to state outputs of the test controller circuitry, parallel outputs, and a data output;
    a data register having an input coupled to the test data in input, control inputs coupled to the state outputs, parallel outputs and parallel inputs, and a data output; and
    multiplexer circuitry having data inputs coupled to the data outputs of the instruction register and the data register, having a control input coupled to the state outputs, and a data output coupled to the test data out output.

3. The communication circuitry of claim 1 including an integrated circuit containing the test data in input, the bi-directional test mode select terminal, the test clock input, the test data out output, the test access port circuitry, the serial communication circuitry, and the counter.

4. The communication circuitry of claim 1 in which the test controller circuitry has four state output bits defining sixteen states.

5. The communication circuitry of claim 1 in which the test controller circuitry has four state output bits defining a Test Logic Reset state, a Run Test/Idle state, a Select-DR state, and a Select-IR state.

6. The communication circuitry of claim 1 in which the test controller circuitry has four state output bits defining a Run Test/Idle state, a Shift-DR state, a Pause-DR state, a Shift-IR state, and a Pause-IR state.

7. The communication circuitry of claim 1 in which the counter has an input coupled to the test data in input and a data output coupled to the test data out output.

* * * * *